United States Patent
Ohnuma et al.

(10) Patent No.: US 6,916,693 B2
(45) Date of Patent: Jul. 12, 2005

(54) SEMICONDUCTOR DEVICE AND MANUFACTURING METHOD THEREOF

(75) Inventors: Hideto Ohnuma, Kanagawa (JP); Chiho Kokubo, Kanagawa (JP); Koichiro Tanaka, Kanagawa (JP); Naoki Makita, Nara (JP); Shuhei Tsuchimoto, Nara (JP)

(73) Assignees: Semiconductor Energy Laboratory Co., Ltd. (JP); Sharp Kabushiki Kaisha (JP)

(*) Notice: Subject to any disclaimer, the term of this patent is extended or adjusted under 35 U.S.C. 154(b) by 0 days.

(21) Appl. No.: 09/799,373

(22) Filed: Mar. 5, 2001

(65) Prior Publication Data

US 2001/0021544 A1 Sep. 13, 2001

(30) Foreign Application Priority Data

Mar. 8, 2000 (JP) ..................................... 2000-062955
Mar. 8, 2000 (JP) ..................................... 2000-062981

(51) Int. Cl.$^7$ .......................... H01L 21/00; H01L 21/84
(52) U.S. Cl. ......................... 438/162; 438/520; 438/528
(58) Field of Search ................................ 438/162, 520, 438/528, FOR 184, FOR 201

(56) References Cited

U.S. PATENT DOCUMENTS

| 5,247,190 A |   | 9/1993  | Friend et al. |         |
|-------------|---|---------|---------------|---------|
| 5,399,502 A |   | 3/1995  | Friend et al. |         |
| 5,529,937 A |   | 6/1996  | Zhang et al.  |         |
| 5,550,070 A | * | 8/1996  | Funai et al. ................. | 438/486 |
| 5,643,826 A |   | 7/1997  | Ohtani et al. |         |
| 5,681,759 A |   | 10/1997 | Zhang         |         |
| 5,830,784 A |   | 11/1998 | Zhang et al.  |         |
| 5,879,974 A | * | 3/1999  | Yamazaki ..................... | 438/162 |
| 5,879,977 A |   | 3/1999  | Zhang et al.  |         |
| 5,897,347 A |   | 4/1999  | Yamazaki et al. |       |

(Continued)

FOREIGN PATENT DOCUMENTS

| EP | 0 651 431       |   | 5/1995  |             |
|----|-----------------|---|---------|-------------|
| EP | 0978877 A2      |   | 2/2000  |             |
| JP | 04130735 A      | * | 5/1992  | ......... H01L/21/336 |
| JP | 7-183540        |   | 7/1995  |             |
| JP | 07335547 A      | * | 12/1995 | ........... H01L/21/20 |
| JP | 10-92576        |   | 4/1998  |             |
| JP | 11-097702       |   | 4/1999  |             |
| JP | 11261077 A      | * | 9/1999  | ......... H01L/29/786 |
| JP | 2001326178 A    | * | 11/2001 | ........... H01L/21/20 |
| JP | 2001326363 A    | * | 11/2001 | ......... H01L/29/786 |
| WO | WO 90/13148     |   | 11/1990 |             |

OTHER PUBLICATIONS

JP 11–097702 English abstract.
English abstract re Japanese Patent Application No. JP 7–183540, published Jul. 21, 1995.

*Primary Examiner*—George Fourson
*Assistant Examiner*—Michelle Estrada
(74) *Attorney, Agent, or Firm*—Cook, Alex, McFarron, Manzo, Cummings & Mehler, Ltd.

(57) ABSTRACT

In a crystallization process of an amorphous semiconductor film, a first crystalline semiconductor film having crystalline regions, and dotted with amorphous regions within the crystalline regions, is obtained by performing heat treatment processing after introducing a metallic element which promotes crystallization on the amorphous semiconductor film. The amorphous regions are kept within a predetermined range by regulating the heat treatment conditions at this point. Laser annealing is performed on the first crystalline semiconductor film, to form a second crystalline semiconductor film. Electrical characteristics for a TFT manufactured based on the second crystalline semiconductor film can be obtained having less dispersion.

18 Claims, 25 Drawing Sheets

U.S. PATENT DOCUMENTS

| | | | |
|---|---|---|---|
| 5,904,770 A | 5/1999 | Ohtani et al. | |
| 5,923,962 A | 7/1999 | Ohtani et al. | 438/150 |
| 5,923,966 A * | 7/1999 | Teramoto et al. | 438/162 |
| 6,066,547 A | 5/2000 | Maekawa | |
| 6,071,764 A | 6/2000 | Zhang et al. | |
| 6,077,758 A | 6/2000 | Zhang et al. | |
| 6,088,070 A | 7/2000 | Ohtani et al. | |
| 6,110,770 A | 8/2000 | Zhang et al. | |
| 6,160,279 A | 12/2000 | Zhang et al. | |
| 6,232,156 B1 | 5/2001 | Ohtani et al. | |
| 6,285,042 B1 | 9/2001 | Ohtani et al. | 257/66 |
| 6,312,979 B1 * | 11/2001 | Jang et al. | 438/166 |
| 6,326,226 B1 * | 12/2001 | Jang et al. | 438/486 |
| 6,335,541 B1 | 1/2002 | Ohtani et al. | 257/59 |
| 6,417,031 B2 | 7/2002 | Ohtani et al. | |
| 6,420,246 B1 * | 7/2002 | Yamazaki et al. | 438/476 |
| 6,451,638 B1 | 9/2002 | Zhang et al. | |
| 6,455,401 B1 | 9/2002 | Zhang et al. | |
| 6,461,899 B1 | 10/2002 | Kitakado et al. | |
| 6,465,287 B1 * | 10/2002 | Yamazaki et al. | 438/162 |
| 6,482,721 B1 * | 11/2002 | Lee | 438/486 |
| 6,495,404 B1 * | 12/2002 | Teramoto et al. | 438/166 |
| 6,537,863 B1 * | 3/2003 | Jung | 438/166 |
| 6,541,918 B1 * | 4/2003 | Yudasaka | 315/169.3 |
| 2001/0000011 A1 | 3/2001 | Zhang et al. | |
| 2001/0021544 A1 | 9/2001 | Ohnuma et al. | |
| 2001/0050364 A1 | 12/2001 | Tanaka et al. | |
| 2002/0053670 A1 | 5/2002 | Ohtani et al. | 257/64 |

* cited by examiner

FIG. 12
SIDE VIEW
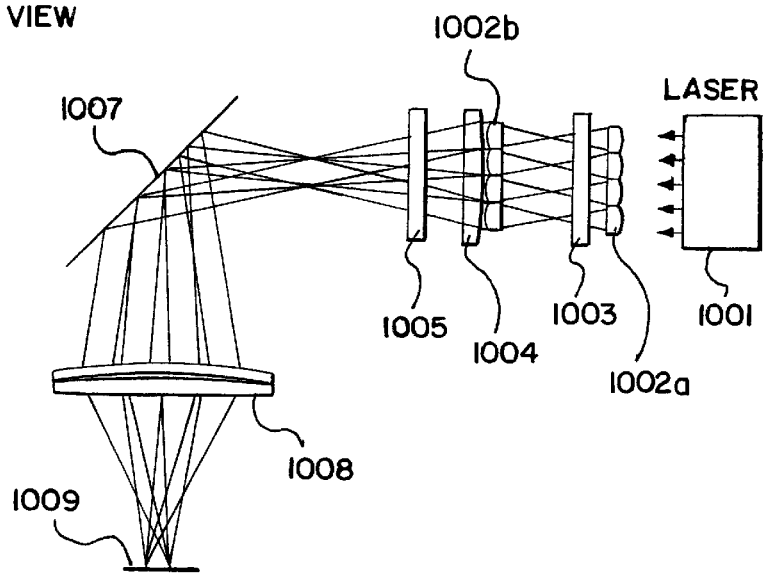
TOP VIEW
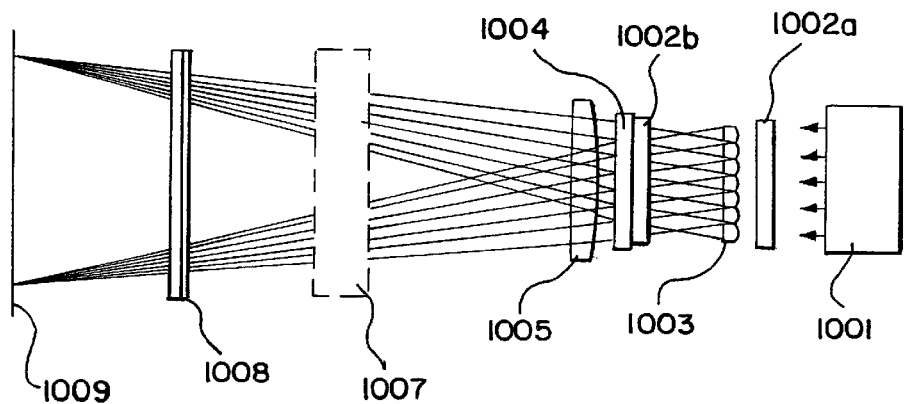

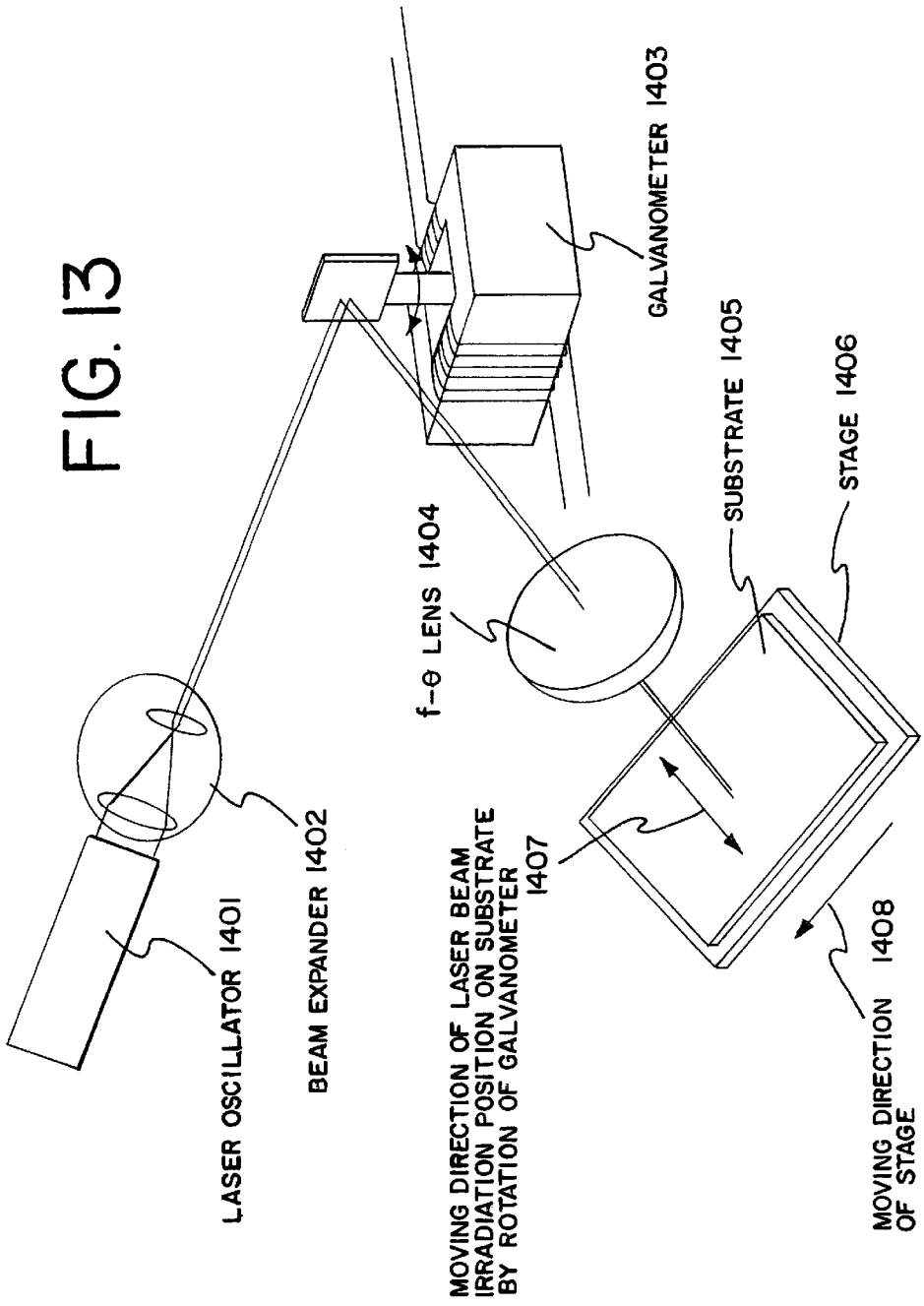

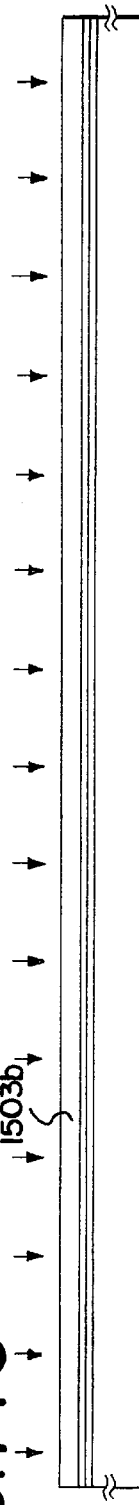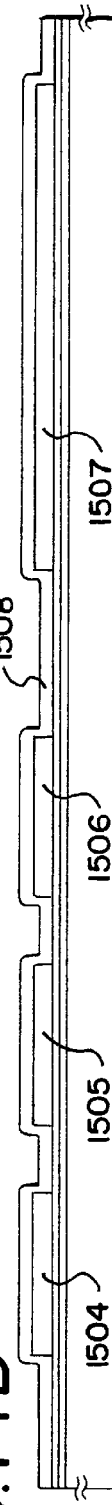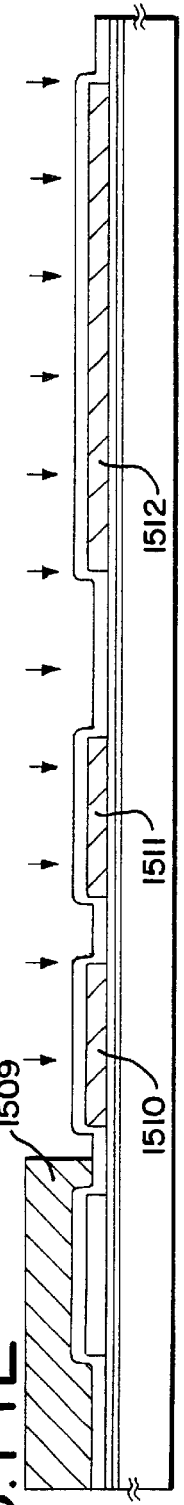

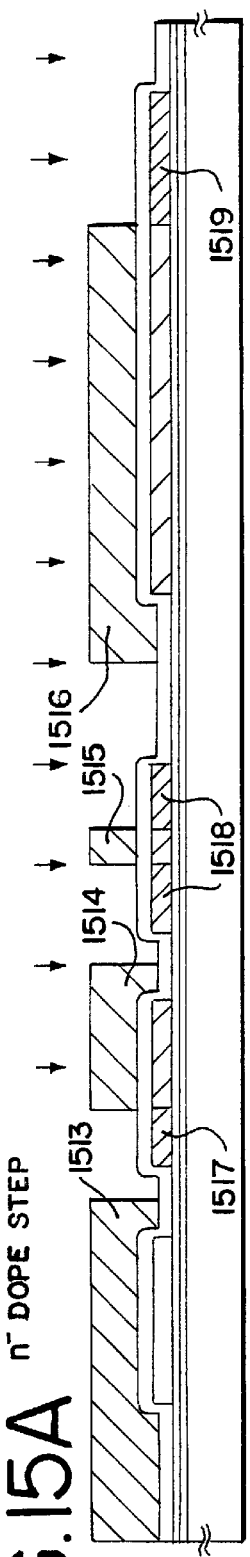
FIG. 15A  n⁻ DOPE STEP
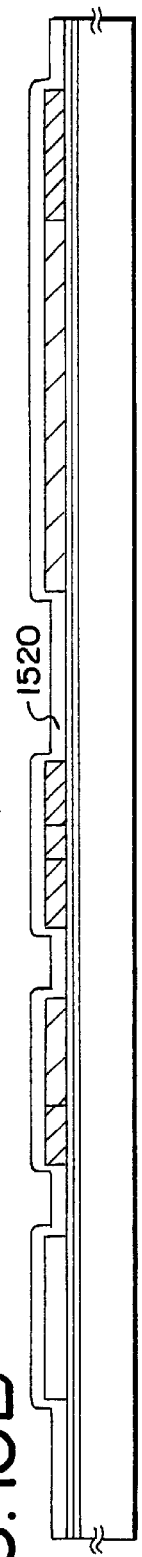
FIG. 15B  STEP OF REMOVING MASK LAYER/LASER ACTIVATION STEP/STEP OF FORMING GATE INSULATING FILM
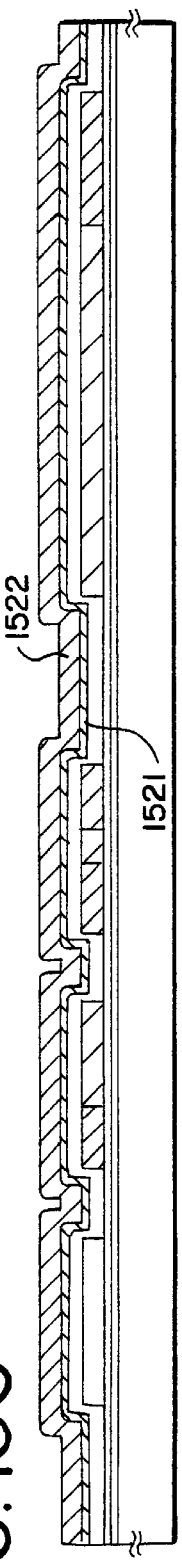
FIG. 15C  STEP OF FORMING FIRST CONDUCTIVE LAYER
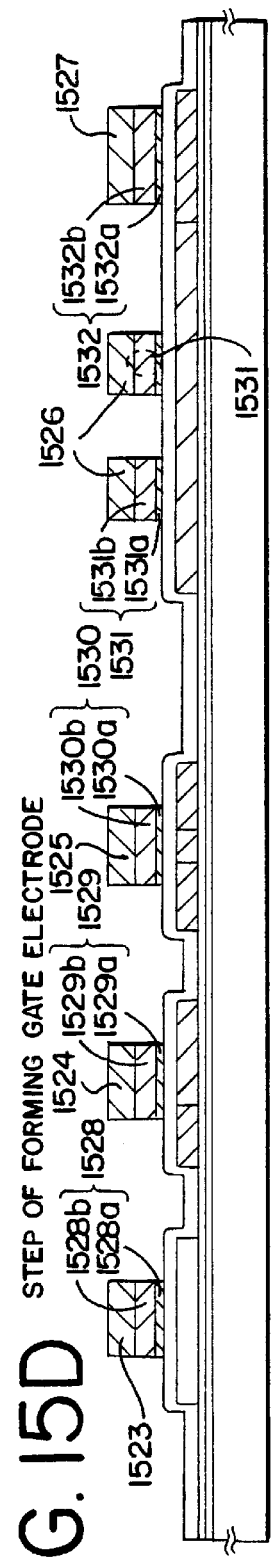
FIG. 15D  STEP OF FORMING GATE ELECTRODE

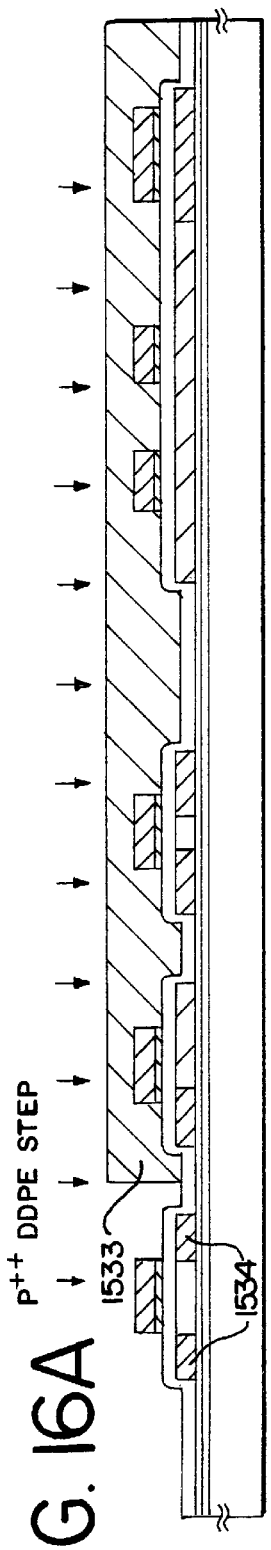
FIG. 16A $p^{++}$ DDPE STEP
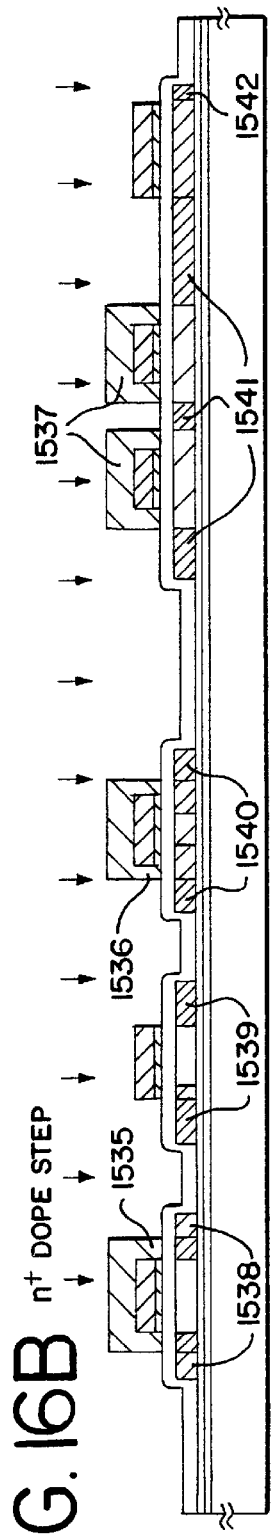
FIG. 16B $n^+$ DOPE STEP
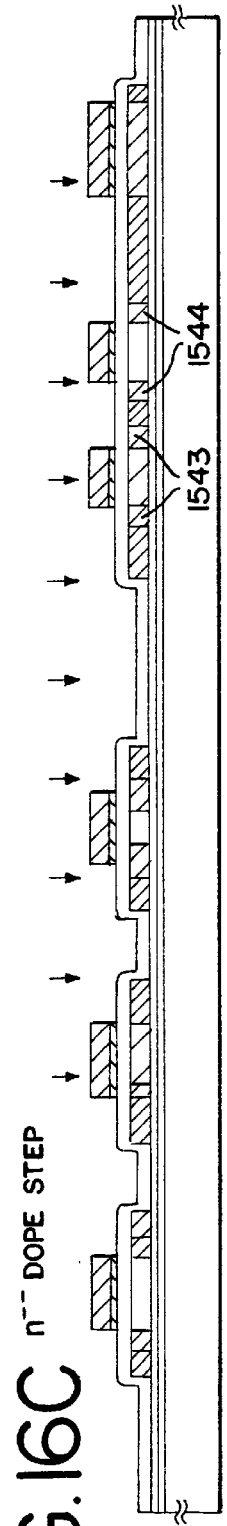
FIG. 16C $n^-$ DOPE STEP
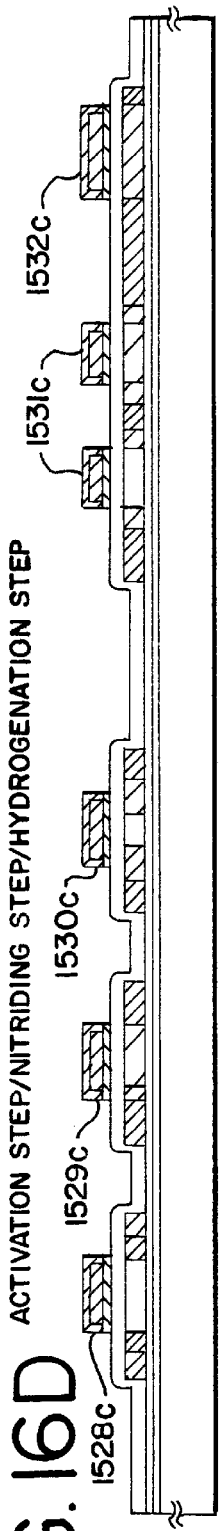
FIG. 16D ACTIVATION STEP/NITRIDING STEP/HYDROGENATION STEP

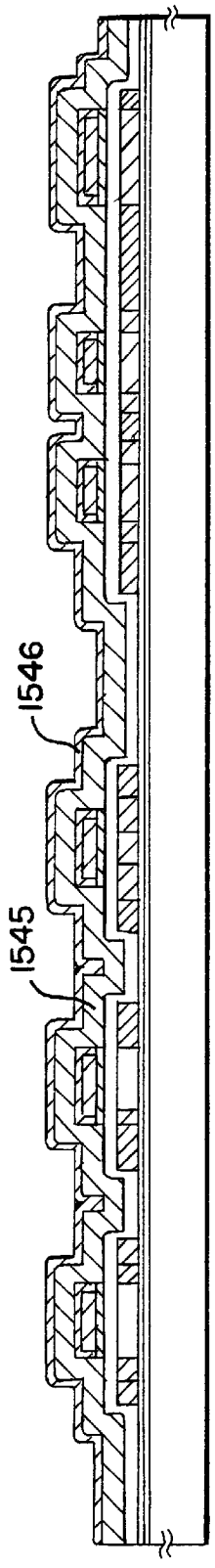
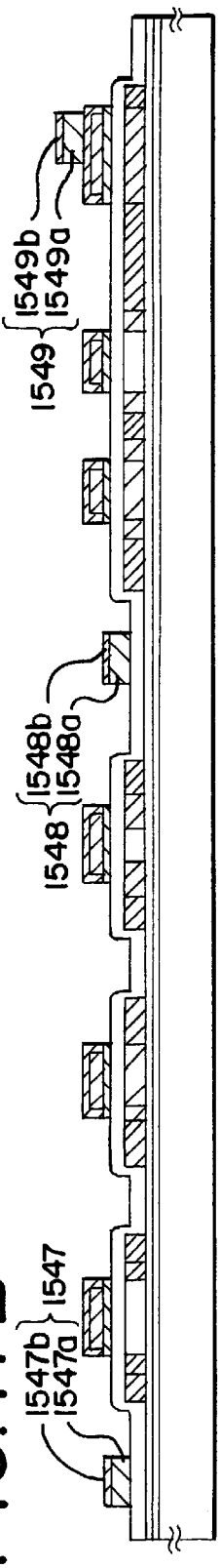
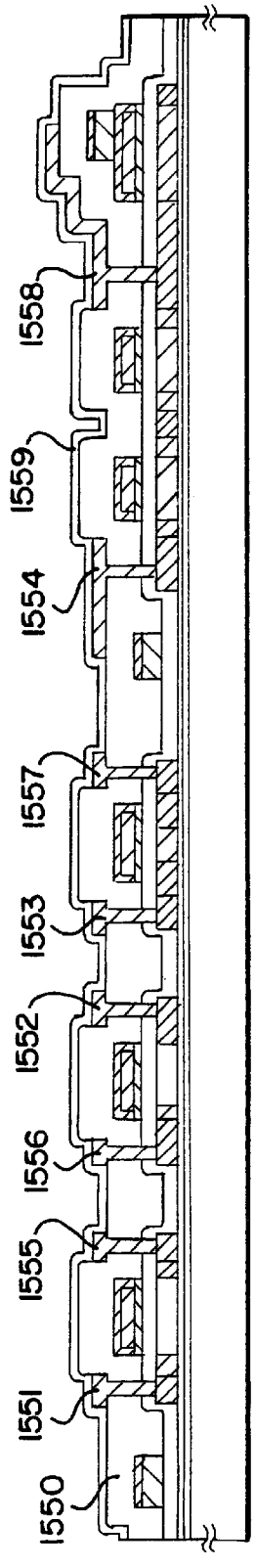

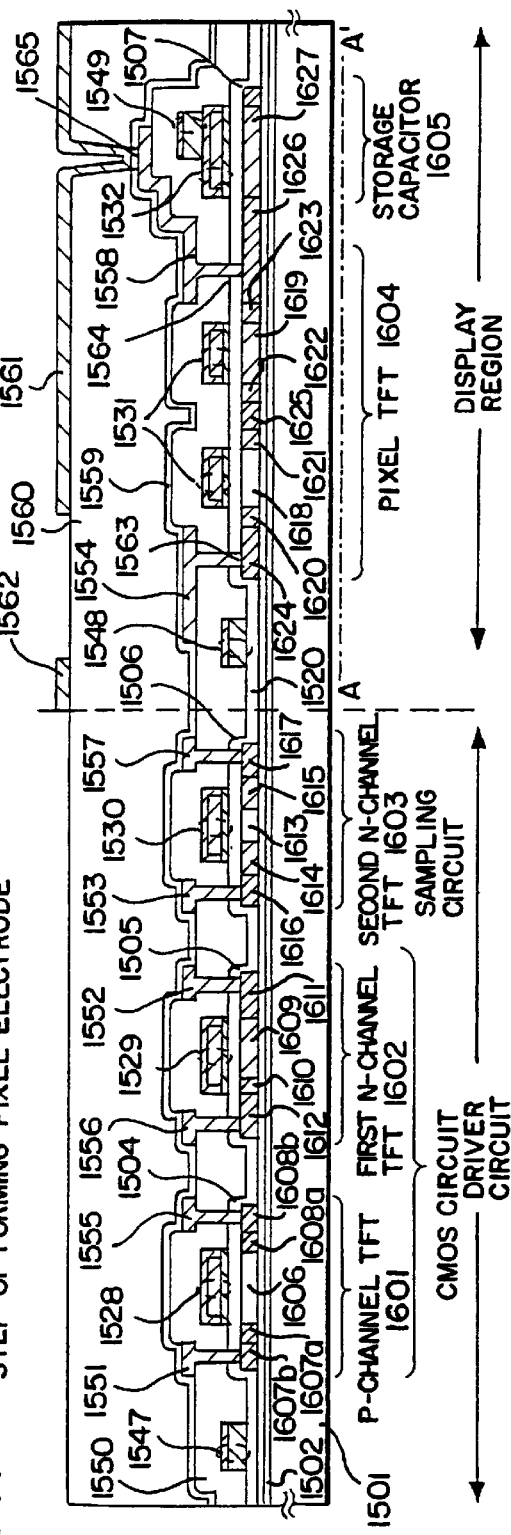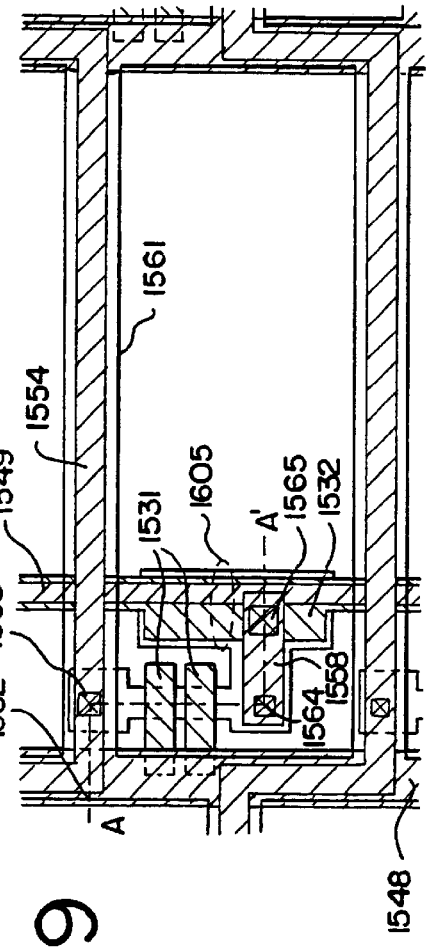

FIG. 21A STEP OF FORMING AMORPHOUS SEMICONDUCTOR FILM
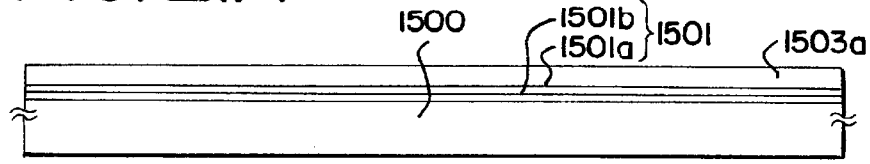
FIG. 21B STEP OF ADDING CATALYTIC ELEMENT
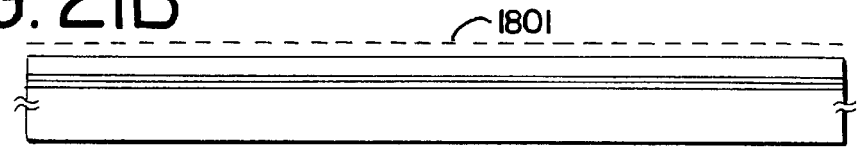
FIG. 21C LASER ANNEALING STEP
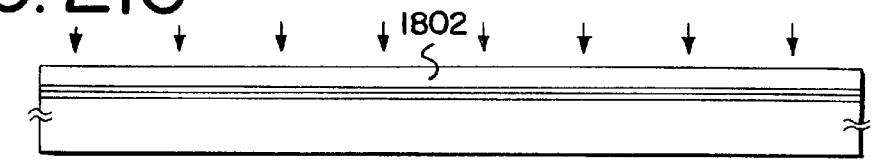
FIG. 22A STEP OF FORMING AMORPHOUS SEMICONDUCTOR FILM
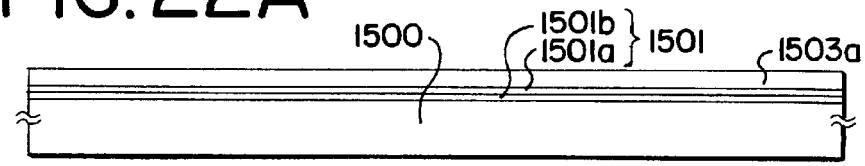
FIG. 22B STEP OF ADDING CATALYTIC ELEMENT
FIG. 22C CRYSTALLIZATION STEP (HEAT CRYSTALLIZATION)
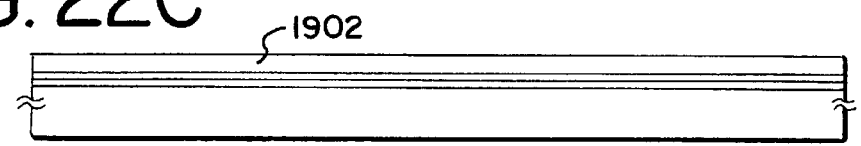
FIG. 22D LASER ANNEALING STEP
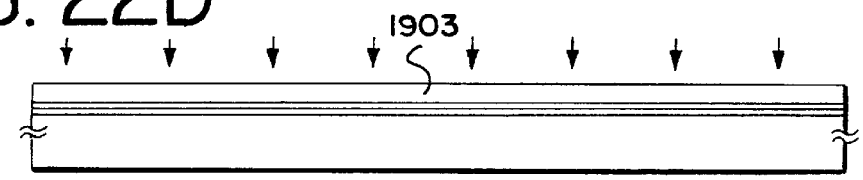

FIG. 25A
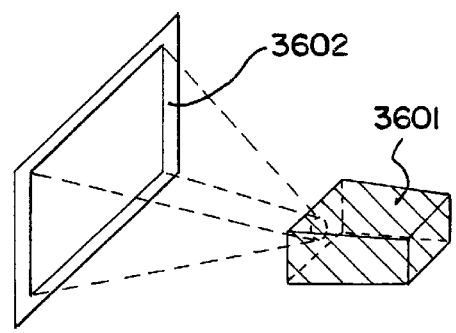
FIG. 25B
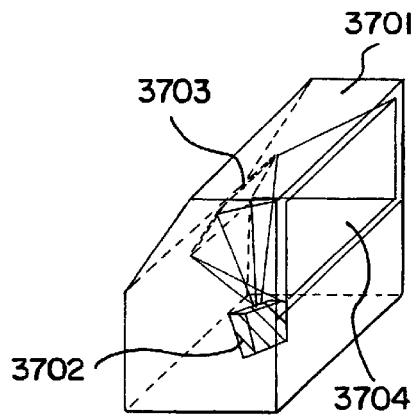
FIG. 25C PROJECTING APPARATUS (THREE-PLATE TYPE)
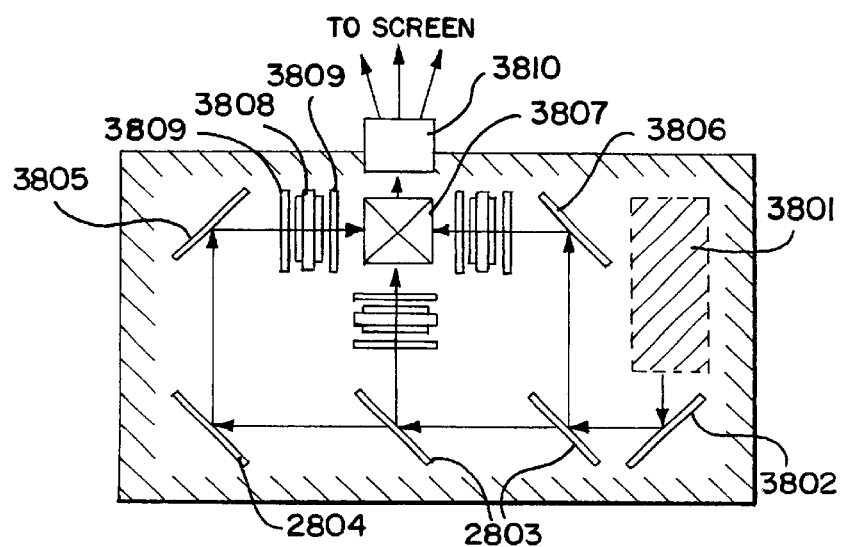
FIG. 25D  LIGHT SOURCE OPTICAL SYSTEM
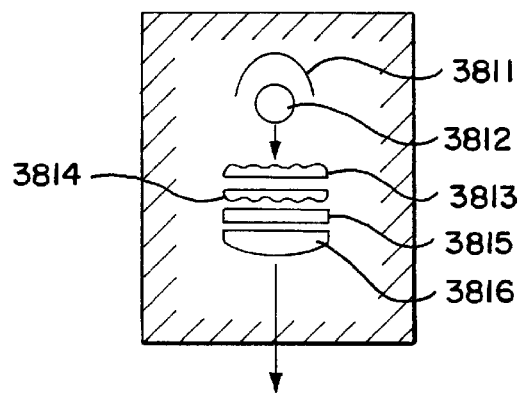

SEMICONDUCTOR DEVICE AND MANUFACTURING METHOD THEREOF

BACKGROUND OF THE INVENTION

1. Field of the Invention

The present invention relates to a semiconductor device having a circuit formed by a thin film transistor (hereafter referred to as a TFT), and to a method of manufacturing the semiconductor device. For example, the present invention relates to an electro-optical device, typically a liquid crystal display device, and to electronic equipment provided with the electro-optical device as a part. Note that, throughout this specification, the term semiconductor device indicates general devices which function by utilizing semiconductor characteristics, and that the above electro-optical device and electronic equipment fall under the semiconductor device category.

2. Description of the Related Art

Techniques of crystallizing and increasing crystallinity of an amorphous semiconductor film formed on an insulating substrate such as glass by performing heat treatment, laser annealing, or both heat treatment and laser annealing have been widely researched in recent years. Silicon is often used in the semiconductor film.

Crystallized semiconductor films obtained in accordance with the above techniques are referred to as crystalline semiconductor films. The crystalline semiconductor films have extremely high mobility in comparison with amorphous semiconductor films. A monolithic type liquid crystal electro-optical device (a semiconductor device in which thin film transistors (TFTs) for a pixel driver and a driver circuit are manufactured on one substrate) which cannot be realized by a semiconductor device manufactured using a conventional amorphous semiconductor film, for example, can therefore be manufactured if a crystalline semiconductor film is utilized.

The crystalline semiconductor films are thus semiconductor films having extremely good characteristics compared to amorphous semiconductor films. This is why the above stated research is being carried out. For example, it is necessary to have a heat treatment temperature equal to or greater than 600° C., and a heat treatment time equal to or greater than 10 hours, preferably equal to or greater than 20 hours, when performing crystallization of an amorphous semiconductor film by using heat treatment. Substrates, which can withstand these crystallization conditions, include quartz substrates, for example. However, quartz substrates are high cost, and are lacking in processability. In particular, they are extremely difficult to be processed into a large surface area. Increasing the surface area of the substrate is indispensable for raising mass production efficiency, in particular. Work towards increasing the surface area of the substrate for increasing mass production efficiency has been remarkable in recent years, and a substrate size of 600×720 mm is becoming more and more of a standard for newly constructed mass production lines.

The processing of a quartz substrate into this type of large surface area substrate is difficult with present techniques, and even if it were possible, would not happen at present due to the costs or production. Glass is available, for example, as a material which can easily be manufactured into a large surface area substrate. A glass substrate referred to as Corning #7059 exists, for example, as this type of glass substrate. Corning #7059 is extremely low cost, has good processability, and is easily made into a large surface area substrate. However, Corning #7059 has a softening temperature of 593° C., and has a problem in heat treatment at 600° C. or higher.

Corning #1737 exists as one glass substrate with a relatively high softening temperature. The softening temperature is high at 667° C. If an amorphous semiconductor film is formed on a Corning #1737 substrate, and the substrate is then placed in a 600° C. atmosphere for 20 hours, there is almost no change in shape of the substrate which will influence manufacturing. However, a heat treatment time of 20 hours is too long in a mass production process, and from the point of view of costs, it is preferable to lower the heat treatment temperature of 600° C., even by a small amount.

A novel method of crystallization has been proposed in order to resolve these types of problems. This method is recorded in detail in Japanese Patent Application Laid-open No. Hei 7-183540. A simple explanation thereof is presented here. First, a very small amount of an element such as nickel, palladium, or lead is introduced into an amorphous semiconductor film. Methods such as plasma processing, evaporation, ion injection, sputtering, and liquid application can be utilized as the introduction method. Then, if the amorphous semiconductor film is placed, for example, in a 550° C. nitrogen atmosphere for 4 hours, a crystalline semiconductor film having good characteristics can be obtained. The optimal heat treatment temperature and heat treatment time for crystallization are dependent upon the amount of the element introduced and the state of the amorphous semiconductor film.

A method of crystallization of an amorphous semiconductor film in accordance with heat treatment is recorded above. On the other hand, the temperature of the substrate does not increase very much with crystallization by laser annealing, and high energy can be imparted to only the amorphous semiconductor film, and therefore substrates such as plastic substrates can also be used, in addition to glass substrates with low softening temperature.

Lasers such as an XeCl excimer laser, and a KrF excimer laser can be given as examples of the types of lasers which can be used in laser annealing. A method for performing laser annealing in which: a pulse laser beam from a high output excimer laser is processed into a square spot of several centimeters in size, or into a linear shape having a length equal to or greater than 10 cm, on an irradiation surface by an optical system; and in which the laser beam is then scanned (or the laser beam irradiation position is moved relatively with respect to the irradiation surface), has high productivity and is industrially superior. This method is therefore used preferably.

In particular, when a beam in which the shape of the laser beam is linear in the irradiation surface (hereafter referred to as a linear beam) is used, the entire irradiation surface can be irradiated by scanning the linear beam in only a direction perpendicular to the linear direction of the linear beam, differing from the use of a spot laser beam in which it is necessary to scan forward and backward, and left and right. Productivity is therefore high. Scanning in a direction perpendicular to the linear direction is performed because that is the most efficient scanning direction. This high productivity is the main factor in the present use pulse emission excimer lasers processed into a linear beam by a suitable optical system for laser annealing.

Further, there is also a method of performing crystallization of an amorphous semiconductor film by laser annealing after crystallization is performed in accordance with heat treatment. The characteristics of the semiconductor film may be made better when performing this method compared to performing only heat treatment or only laser annealing.

SUMMARY OF THE INVENTION

In order to obtain a semiconductor film possessing very good electrical characteristics, there is a method, for example, in which additional laser annealing is performed after performing crystallization of an amorphous semiconductor film by heat treatment. The semiconductor film characteristics can be increased when using this method compared to cases of using only heat treatment or only laser annealing. It is necessary to optimize the heat treatment conditions and the laser annealing conditions in order to obtain good electrical characteristics. Although the electrical characteristics of a TFT are greatly increased when a crystalline semiconductor film obtained using this method is made into an active layer of a thin film transistor (TFT), there are also cases when the dispersion of the electrical characteristics becomes striking. An object of the present invention is, therefore, to suppress the dispersion of the electrical characteristics of a TFT manufactured based upon a crystalline semiconductor film by keeping the crystallinity dispersion of the crystalline semiconductor film within a predetermined range after heat treatment processing.

First, an experiment in which the heat treatment time is varied when performing heat treatment of an amorphous semiconductor film is explained. A 10 nm thick silicon nitride oxide film and a 55 nm thick amorphous silicon film were formed on a glass substrate having a 5 inch diagonal by using a plasma CVD apparatus. Note that, throughout this specification, the term, silicon nitride oxide film indicates an insulating film expressed by SiOxNy, where silicon, oxygen, and nitrogen are present in predetermined ratios. An aqueous nickel acetate solution (5 ppm concentration by weight, 5 ml volume) was then applied by spin coating to the surface of the amorphous silicon film utilizing the method recorded in Japanese Patent Application Laid-open No. Hei 7-183540. This was then heat treated in a 500° C. nitrogen atmosphere for 1 hour, and additionally heat treated at a temperature of 550° C. for 4 hours, 8 hours, or 12 hours. The amorphous silicon film was thus changed into a crystalline silicon film. The crystalline silicon film, observed at a magnification of 500× in the bright-field transmission mode of an optical microscope, is shown in FIGS. 1A, 1B, and 1C. FIG. 1A is a photograph of the silicon film heat treated for 4 hours at 550° C., FIG. 1B is a photograph of the silicon film heat treated for 8 hours at 550° C., and FIG. 1C is a photograph of the silicon film heat treated for 12 hours at 550° C. Crystallization by heat treatment at these conditions produces a mixture of crystallized regions (white color regions denoted by reference numeral 5001 in FIG. 5B) and amorphous regions (black color regions denoted by reference numeral 5002 in FIG. 5B). The surface area of the amorphous regions was analyzed by image processing. Note that, throughout this specification, amorphous portions surrounded on the outside by crystalline regions are referred to as amorphous regions.

A method of image processing is explained here. The photo of the crystalline silicon film of FIG. 1A is shown again in FIG. 2A. In order to separate the amorphous regions and the crystallized regions, image processing was performed on the photograph and it was converted into two gray-scales. There are methods of directly converting the photograph into two gray-scales, but the influence of lightness and darkness due to the lens appears strongly when exposing the photograph. In order to suppress the influence of lightness and darkness, it is better to separate the photograph into channels such as RGB (red, green, blue) or CMYK (cyan, magenta, yellow, black), and then to form the two gray-scales. The image processing can be easily performed if a method of dividing the photograph by RGB is used.

The photograph was separated into three channels, an R channel, a G channel, and a B channel, and the photographs are shown in FIGS. 2B, 3A, and 3B, respectively. Gray-scale (brightness) histograms for each separated channel are shown in FIG. 4. It can be seen that while only one peak appears in the R channel and the B channel, two peaks appear in the G channel. It is therefore understood that the amorphous regions and the crystallized regions can only be separated with the G channel. The G channel image was separated at the local minimum existing between the two peaks shown by FIG. 4, and changed into two gray-scales, as shown in FIG. 5A. The crystalline silicon film shown by FIG. 2A, which has amorphous regions, can thus be divided into crystallized regions and amorphous regions.

Image processing similar to that performed in FIG. 2A is then performed for FIGS. 1A to 1C, and the surface area of the amorphous regions was calculated using software. The relationship between the heat treatment time and the total surface area of the amorphous regions with respect to the total surface area of the silicon film after heat treatment is shown in FIG. 6A. From FIG. 6A, the longer the heat treatment time, the lower the ratio of the total surface area of the amorphous regions becomes.

Further, the surface area of each of the amorphous regions in FIG. 5A was calculated using software, and the results are shown in FIG. 6B. FIG. 6B is a probable statistical distribution diagram, and the horizontal axis shows the surface area of the amorphous regions while the vertical axis shows the probability. In FIG. 6B, the circular symbols show the amorphous region surface area after heat treatment for 4 hours, the triangular symbols after heat treatment for 8 hours, and the x symbols after heat treatment for 12 hours. From FIG. 6B, it can be seen that although amorphous regions having a surface area equal to or greater than $10\,\mu m^2$ exist after 4 hours of heat treatment, they do not exist after 8 hours or 12 hours of heat treatment. In addition, the dispersion of the amorphous region surface area after 4 hours of heat treatment is larger than that of the other cases.

Laser annealing was then performed on each of the crystalline silicon films. The results of measurements of the n-channel electrical characteristics of thin film transistors (TFTs) manufactured based on the crystalline silicon film are shown in the probable statistical distribution diagrams of FIGS. 7A to 7C. The circle, triangle, and x shape symbols used in FIGS. 7A to 7C correspond to conditions which are the same as in FIG. 6B. FIG. 7A shows the Vth with respect to the surface area of the amorphous regions, FIG. 7B shows the S value with respect to the surface area of the amorphous regions, and FIG. 7C shows the mobility with respect to the surface area of the amorphous regions. Large dispersions have developed in the characteristics of the 4 hour heat treatment case compared to the characteristics of the 8 hours or 12 hours heat treatment case. In other words, it can be seen that if the ratio of the total surface area of the amorphous regions with respect to the total surface area of the silicon film shown by FIG. 6A is large, dispersion of the electrical characteristics develops. Further, there is correlation between the development of dispersion in the surface area of the amorphous regions in the 4 hour heat treatment shown by FIG. 6B and the development of dispersion in the electric characteristics shown by FIGS. 7A to 7C.

An experiment in which the heat treatment temperature was varied when performing heat treatment of an amorphous silicon film is explained next. A 100 nm thick silicon nitride oxide film and a 55 nm thick amorphous silicon film were formed on a glass substrate having a 5 inch diagonal by using a plasma CVD apparatus. An aqueous nickel acetate solution (10 ppm concentration by weight, 5 ml volume) was then applied to the surface of the amorphous silicon film by spin coating. This was then heat treated in a 500° C. nitrogen atmosphere for 1 hour, and additionally heat treated for 4 hours at a temperature of 550° C., 575° C., or 600° C. The amorphous silicon film was thus changed into a crystalline silicon film. The crystalline silicon film, observed at a magnification of 500× in the bright-field transmission mode of an optical microscope, is shown in FIGS. 8A, 8B, and 8C. FIG. 8A is a photograph of the silicon film heat treated at 550° C., FIG. 8B is a photograph of the silicon film heat treated at 575° C., and FIG. 8C is a photograph of the silicon film heat treated at 600° C.

Image processing similar to that performed in FIG. 2A was also performed for FIGS. 8A to 8C, and the crystalline semiconductor film was separated into amorphous regions and crystallized regions. The relationship between the heat treatment temperature and the ratio of the total surface area of the amorphous regions with respect to the total surface area of the silicon film is shown in FIG. 9A. It can be seen from FIG. 9A that the higher the heat treatment temperature, the less observable the amorphous regions become.

Further, the surface area of the amorphous regions separated by the image processing is shown in a probable statistical distribution diagram in FIG. 9B. In FIG. 9B, circular symbols show the probable statistical distribution for the silicon film after heat treatment at 550° C., triangular symbols at 575° C., and x shape symbols at 600° C. From FIG. 9B, amorphous regions having a size equal to or greater than 0.3 $\mu m^2$ exist in the films heat treated at 550° C. and at 575° C., but amorphous regions having a size equal to or greater than 0.3 $\mu m^2$ do not exist in the film heat treated at 600° C.

Laser annealing of each of the crystalline silicon films was then performed while varying the laser power energy conditions. Measurements of the n-channel electrical characteristics of TFTs manufactured based upon the crystalline silicon films are shown in FIGS. 10A to 10H, and in FIGS. 11A to 11D. FIGS. 10A to 10D are for the silicon film heat treated at 500° C. for 1 hour in a nitrogen atmosphere, and additionally heat treated at 550° C. for 4 hours in a nitrogen atmosphere; FIGS. 10E to 10H are for the silicon film heat treated at 500° C. for 1 hour in a nitrogen atmosphere, and additionally heat treated at 575° C. for 4 hours in a nitrogen atmosphere; and FIGS. 11A to 11D are for the silicon film heat treated at 500° C. for 1 hour in a nitrogen atmosphere, and additionally heat treated at 600° C. for 4 hours in a nitrogen atmosphere. FIG. 10A, FIG. 10E, and FIG. 11A show the Vth with respect to laser energy density; FIGS. 10B, 10F, and 11B show the S value with respect to the laser energy density; FIGS. 10C, 10G, and 11C show the shift with respect to the laser energy density; and FIGS. 10D, 10H, and 11D show the mobility with respect to the laser energy density. The term shift refers to the value of the gate voltage when the drain current rises.

Comparing FIGS. 10A to 10H and FIGS. 11A to 11D, the electrical characteristics of TFTs manufactured based upon the crystalline semiconductor film obtained by heat treating the silicon film at 500° C. for 1 hour in a nitrogen atmosphere, and additionally heat treating at 600° C. for 4 hours in a nitrogen atmosphere, are influenced the most by changes in the laser power energy. In other words, if almost no amorphous regions exist within the crystalline silicon film after heat treatment processing, then the electrical characteristics fluctuate greatly due to laser power energy fluctuations.

It can be seen, as stated above, that there is a correlation between the total surface area of the amorphous regions not crystallized after heat treatment processing of the amorphous semiconductor film, and the TFT electrical characteristics. Further, it can be seen that there is a correlation between the surface area of the amorphous regions not crystallized, and the TFT electrical characteristics. In order to solve these problems, a crystalline semiconductor film is obtained with the present invention by using the following means.

A small amount of an element (a metallic element for promoting crystallization) is introduced to an amorphous semiconductor film by utilizing a method such as plasma processing, evaporation, sputtering, ion injection, or liquid application, and the amorphous semiconductor film is crystallized by performing heat treatment processing. In particular, it is important that the entire surface of the amorphous semiconductor film is not crystallized in the heat treatment processing with the present invention, but rather the crystalline semiconductor film is manufactured such that the total surface area of amorphous regions contained within a region which becomes an active layer of one TFT is from 1.0 to 8.0% with respect to the surface area of the region which becomes the TFT active layer, preferably between 1.0 and 6.0%. This is extremely important in order to increase the electrical characteristics. Note that the region which becomes the active layer of the TFT is manufactured within a region in which crystal growth occurs, from the region in which the metallic element is introduced toward its periphery.

The basis for it to be preferable that the total surface area of the amorphous regions contained within the region which becomes the active layer of one TFT be from 1.0 to 8.0%, more preferably between 1.0 and 6.0%, with respect to the surface area of the region which becomes the active layer is explained. First, the lower limit value of 1.0% is explained. The total surface area of the amorphous regions after performing heat treatment for 4 hours at 575° C. in a nitrogen atmosphere is 1.75% of the complete surface area of the crystalline semiconductor film, while the total surface area of the amorphous regions after performing heat treatment for 4 hours at 600° C. in a nitrogen atmosphere is 0.00% of the complete surface area of the crystalline semiconductor film.

Further, from FIGS. 11A to 11D, the electrical characteristics of a TFT manufactured based upon a crystalline semiconductor film which has been heat treated at 600° C. and then laser annealed are greatly influenced by fluctuation in the laser power energy at the time of laser annealing. It is therefore necessary that the total surface area of the amorphous regions after heat treatment processing be equal to or greater than 1.0% of the entire surface area of the crystalline semiconductor film. However, it is preferable that the total surface area of the amorphous regions with respect to observed regions be equal to or greater than 1.0% even when performing observation of the surface of the crystalline semiconductor film locally. The smallest observed region is taken as a region which becomes the active layer of one TFT, and the total surface area of the amorphous regions contained within the region which becomes the active layer of one TFT is set to be equal to or greater than 1.0% with respect to the surface area of the region which becomes the active layer of one TFT.

Setting of the upper limit value to 8.0%, preferably 6.0%, for the total surface area of the amorphous regions contained within the region which becomes the active layer of one TFT, with respect to the surface area of the region which becomes the active layer of one TFT, is explained next. The total surface area of the amorphous regions after performing heat treatment for 4 hours at 550° C. in a nitrogen atmosphere is 9.25% of the complete surface area of the crystalline semiconductor film, while the total surface area of the amorphous regions after performing heat treatment for 8 hours at 550° C. in a nitrogen atmosphere is 5.63% of the complete surface area of the crystalline semiconductor film. From FIGS. 7A to 7C, the electrical characteristics of a TFT manufactured based upon a crystalline semiconductor film which has been heat treated for 4 hours and then laser annealed are greatly influenced by fluctuation, and therefore the upper limit is set to 8.0%, preferably 6.0%. For reasons similar to the case of determining the lower limit value, the total surface area of the amorphous regions contained within the region which becomes the active layer of one TFT is used.

Further, the surface area of the amorphous regions which are not crystallized correlates with the electrical characteristics of the TFT, and therefore it is necessary to introduce a small amount of an element (metallic element for promoting crystallization) to the amorphous semiconductor film, partially crystallize the amorphous semiconductor film by performing heat treatment processing, and manufacture the crystalline semiconductor film in which the surface area of all of the amorphous regions obtained is less than or equal to 10.0 $\mu m^2$, and the surface area of at least one amorphous region is equal to or greater than 0.30 $\mu m^2$. This is extremely important in order to suppress dispersion of the electrical characteristics. However, the amorphous regions are regions within the region which becomes the active layer of the TFT.

Setting of the upper limit of the surface area of the amorphous regions to 10.0 $\mu m^2$ is because, as shown in FIG. 9B and in FIGS. 10A to 10D, the dispersion of the electrical characteristics of TFTs manufactured based upon a crystalline semiconductor film in which laser annealing has been performed on a crystalline semiconductor film having amorphous regions equal to or greater than 10.0 $\mu m^2$ in area is extremely large. However, when laser annealing is performed after heat treatment processing for a case in which the amorphous region surface areas are all less than or equal to 0.3 $\mu m^2$, the electrical characteristics fluctuate greatly in accordance with the laser power energy, as seen in FIG. 9B and FIGS. 11A to 11D. It is therefore necessary that the amorphous region of at least 0.30 $\mu m^2$ in surface area exists.

A semiconductor device is manufactured based on the crystalline semiconductor film manufactured through the above processes. Devices such as thin film transistors (TFTs), diodes, and optical sensors exist as semiconductor devices, and all of them can be manufactured based on the crystalline semiconductor film.

BRIEF DESCRIPTION OF THE DRAWINGS

In the accompanying drawings:

FIG. 12 is an example of an optical system for forming a linear beam;

FIG. 13 is an example of an optical system using a galvanometer and an f-θ lens;

FIGS. 14A to 14E are diagrams showing an example of a manufacturing process according to the present invention;

FIGS. 15A to 15D are diagrams showing the example of the manufacturing process according to the present invention;

FIGS. 16A to 16D are diagrams showing the example of the manufacturing process according to the present invention;

FIGS. 17A to 17C are diagrams showing the example of the manufacturing process according to the present invention;

FIG. 18 is a diagram showing the example of the manufacturing process according to the present invention;

FIG. 19 is a diagram showing a top view of a pixel;

FIGS. 21A to 21C are diagrams showing an example of a manufacturing process according to the present invention;

FIGS. 22A to 22D are diagrams showing an example of a manufacturing process according to the present invention;

FIGS. 25A to 25D are diagrams showing examples of electronic equipment; and

DETAILED DESCRIPTION OF THE PREFERRED EMBODIMENTS

Embodiment Mode

Figure 1A:
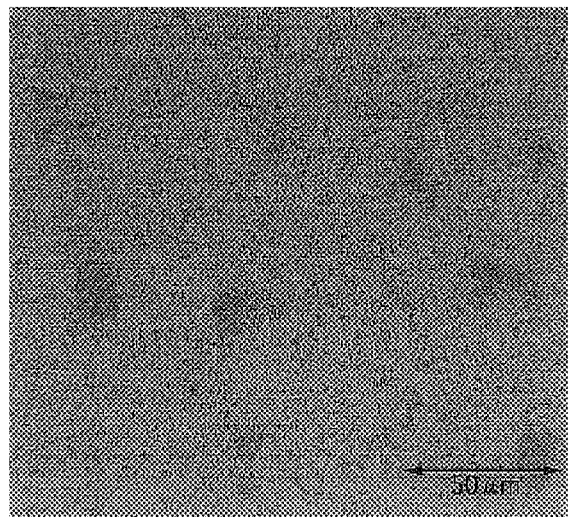
FIG. 1A is a photograph of an amorphous silicon film after heat treatment processing at 550° C. for 4 hours.
Figure 1B:
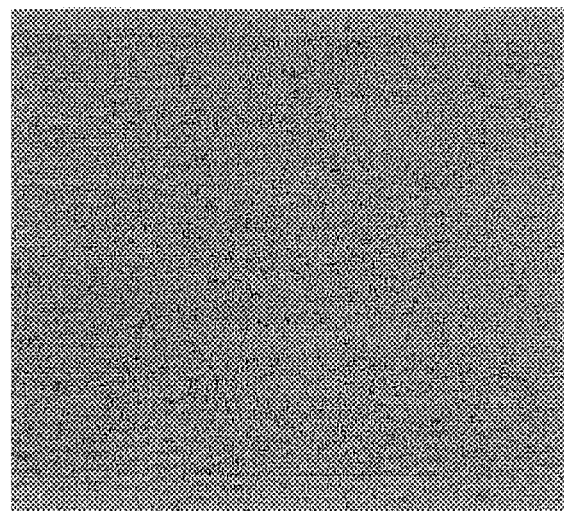
FIG. 1B is a photograph of an amorphous silicon film after heat treatment processing at 550° C. for 8 hours.
Figure 1C:
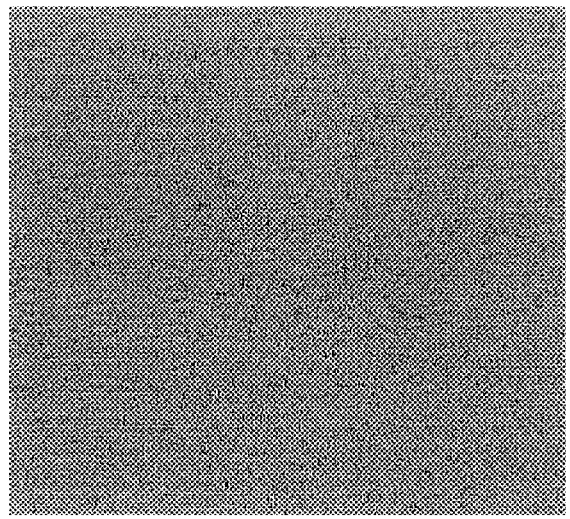
FIG. 1C is a photograph of an amorphous silicon film after heat treatment processing at 550° C. for 12 hours.
Figure 2A:
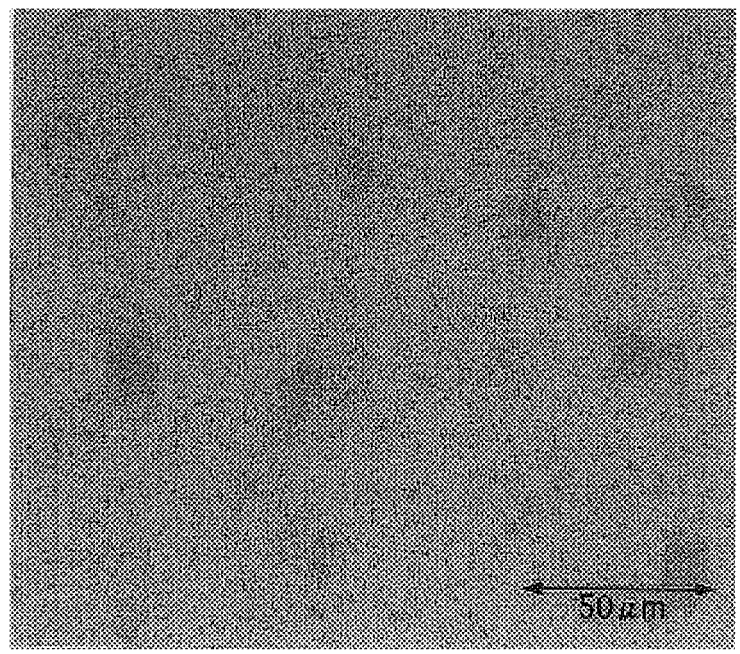
FIG. 2A is a photograph of a surface observed by an optical microscope using a bright-field transmission mode.
Figure 2B:
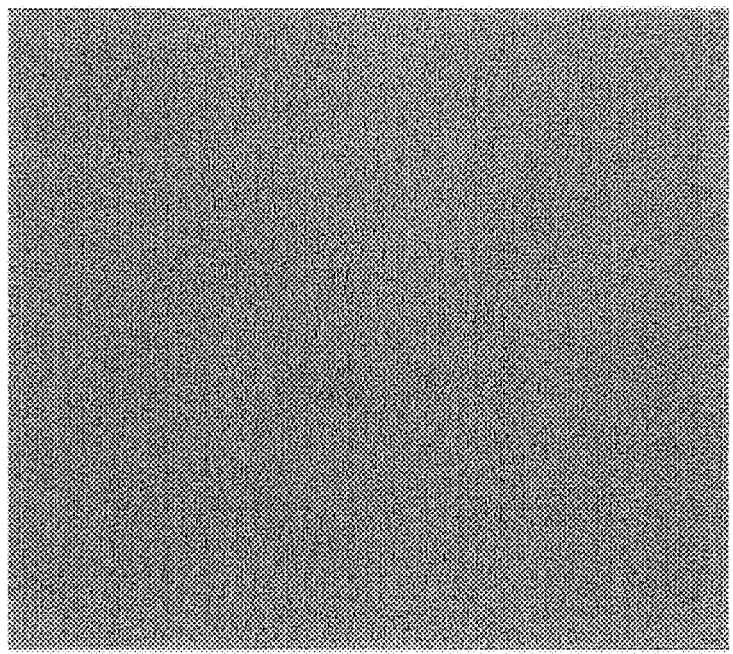
FIG. 2B is a photograph of FIG. 2A separated into an R channel.
Figure 3A:
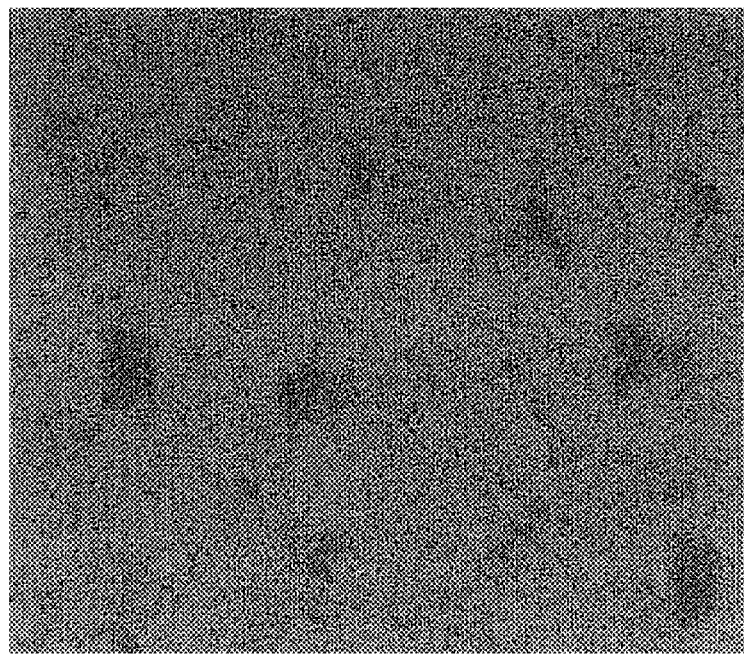
FIG. 3A is a photograph of FIG. 2A separated into a G channel.
Figure 3B:
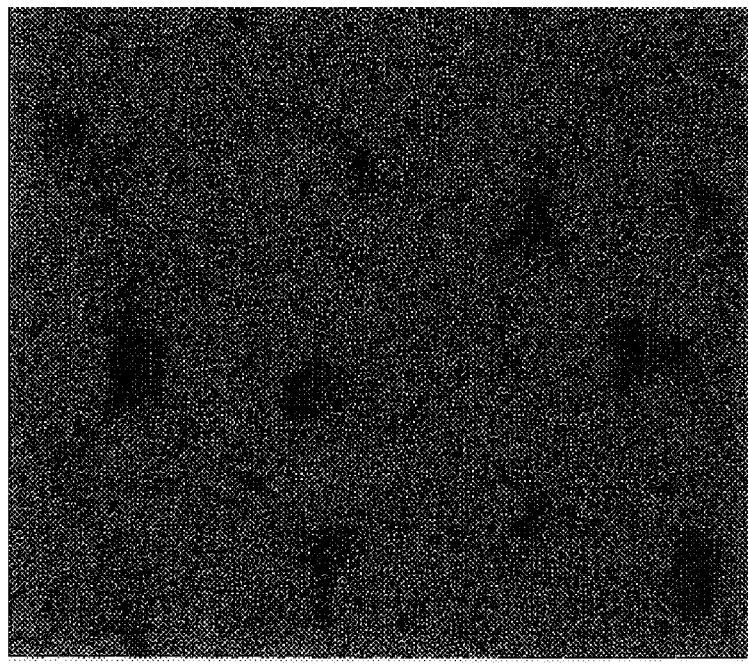
FIG. 3B is a photograph of FIG. 2A separated into a B channel.
Figure 4:
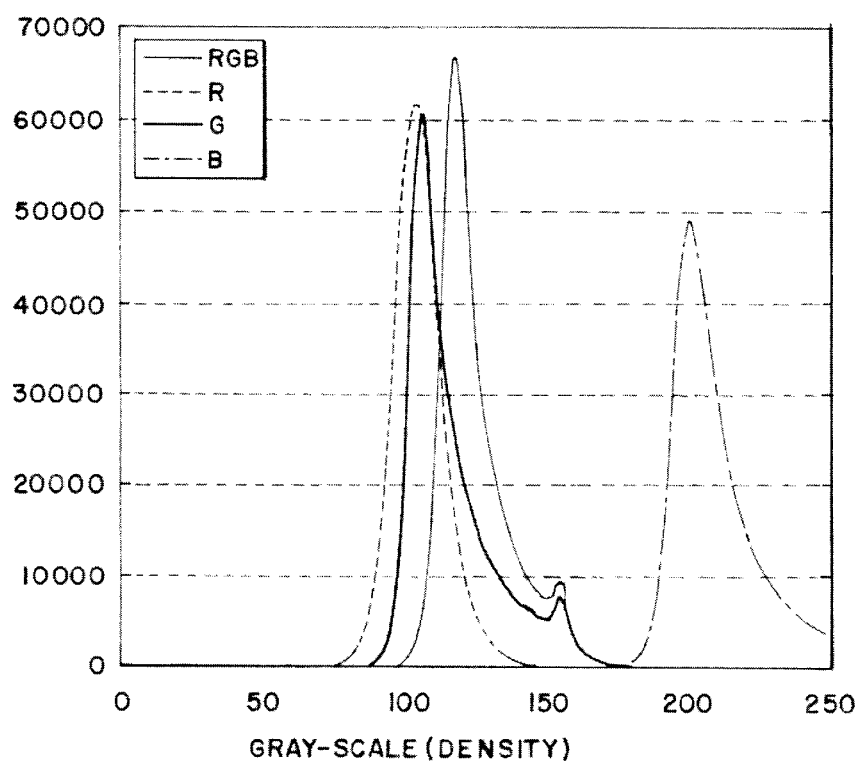
FIG. 4 is a histogram of the gray-scale (brightness) of each mode of FIG. 2A.
Figure 5A:
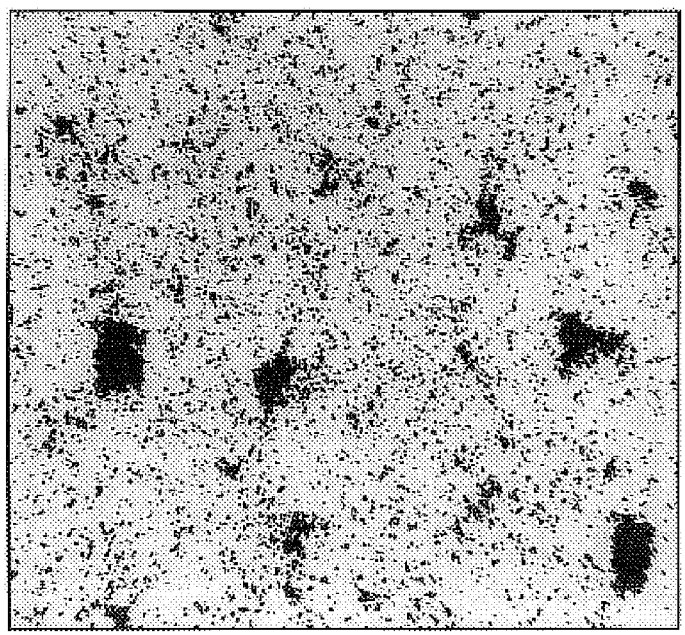
FIG. 5A is a photograph of FIG. 3A made into 2 gray-scales.
Figure 5B:
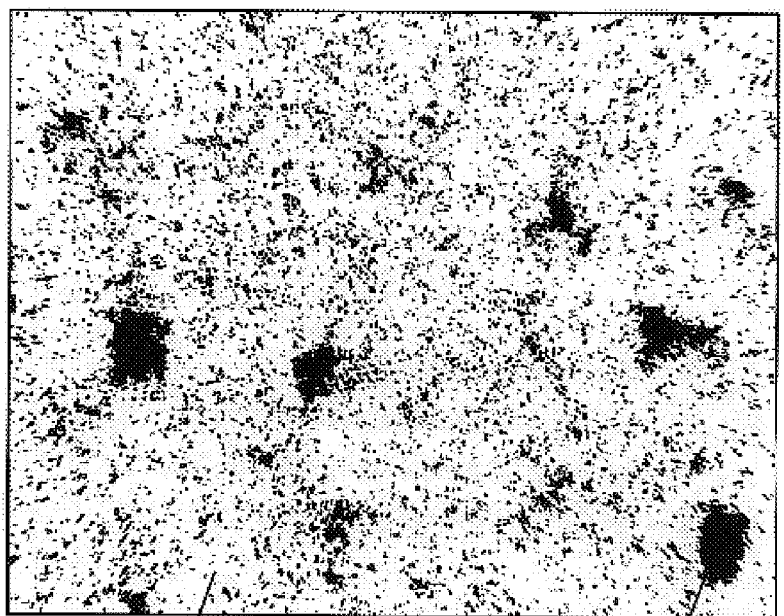
FIG. 5B is a diagram for explaining an amorphous region and a crystal region.
Figure 6A:
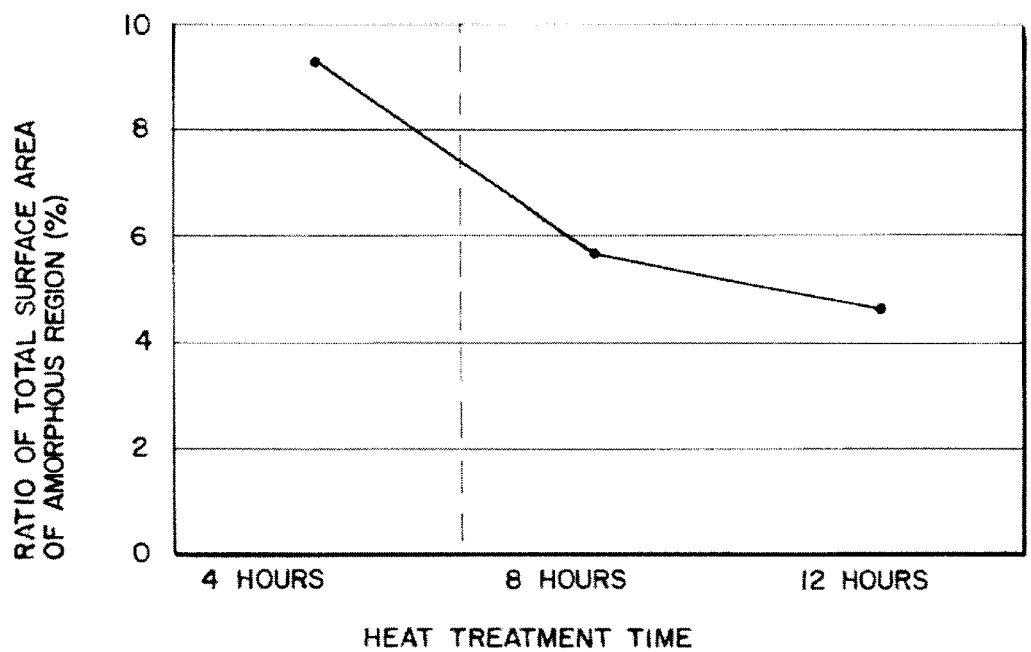
FIGS. 6A and 6B are probable statistical distribution diagrams of the amorphous regions of FIGS. 1A to 1C.
Figure 6B:
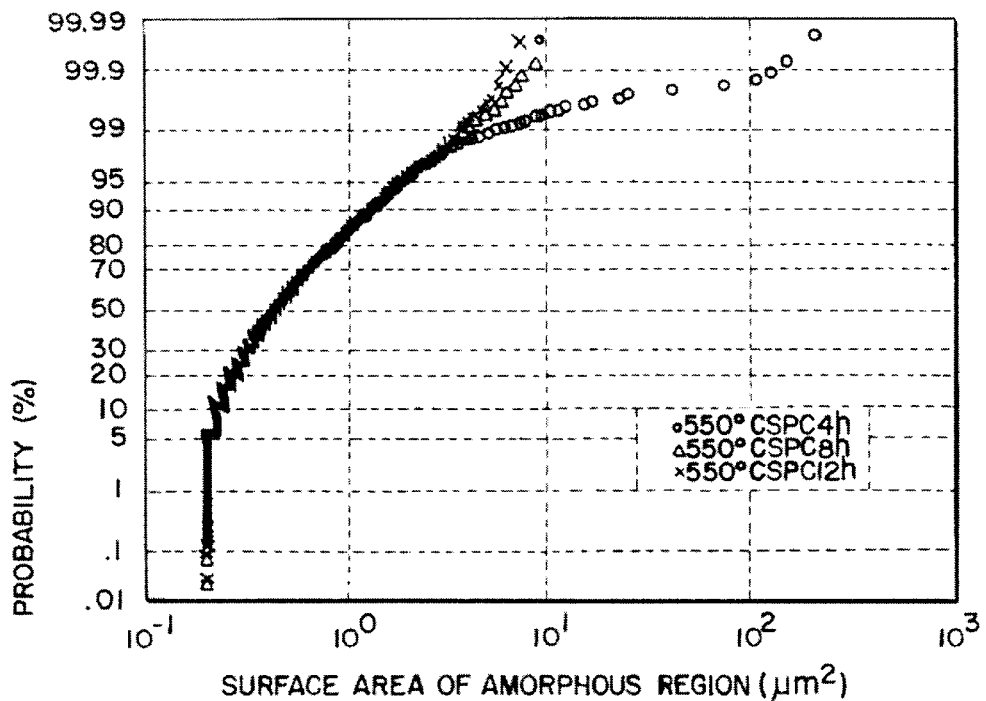
Figure 7A:
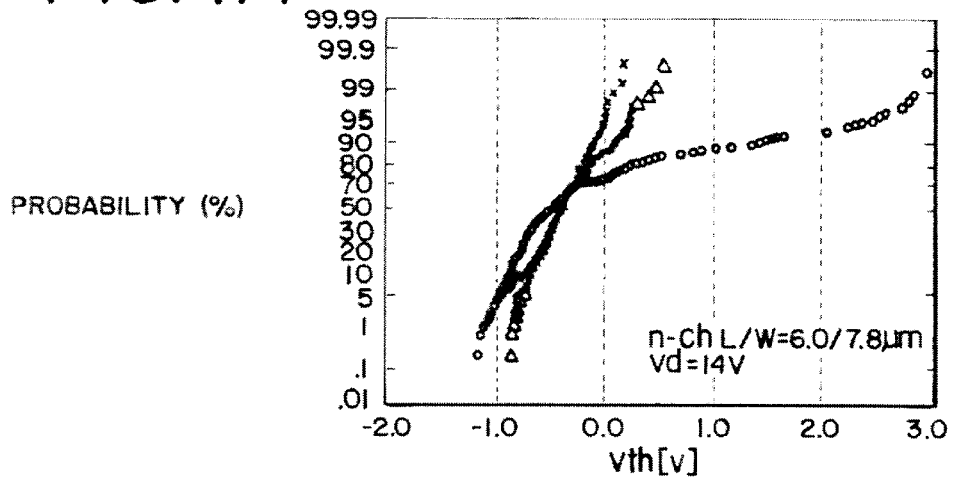
FIG. 7A is a probable statistical distribution diagram of the Vth with respect to heat treatment time when performing heat treatment on an amorphous silicon film.
Figure 7B:
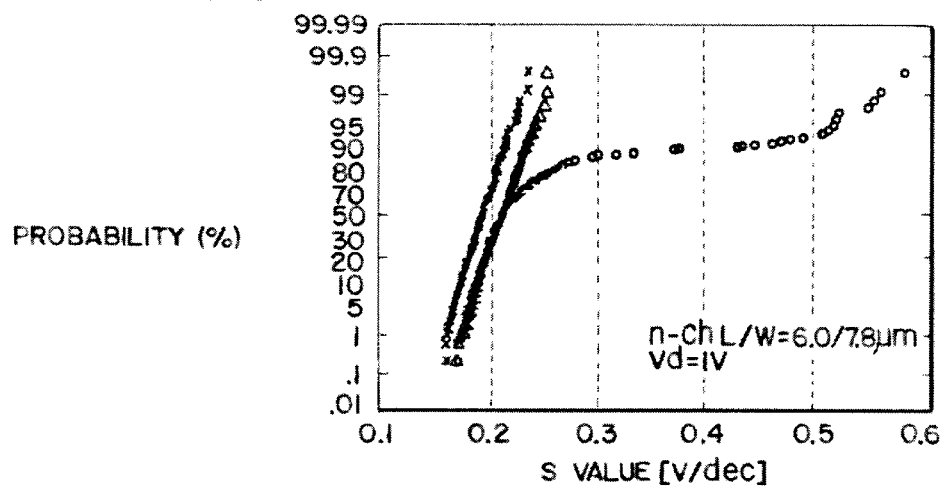
FIG. 7B is a probable statistical distribution diagram of the S value with respect to heat treatment time when performing heat treatment on an amorphous silicon film.
Figure 7C:
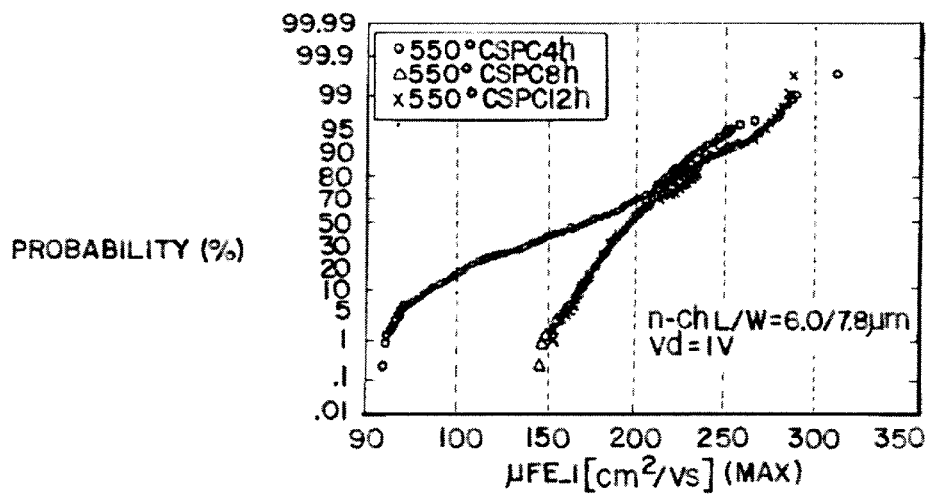
FIG. 7C is a probable statistical distribution diagram of the mobility with respect to heat treatment time when performing heat treatment on an amorphous silicon film.
Figure 8A:
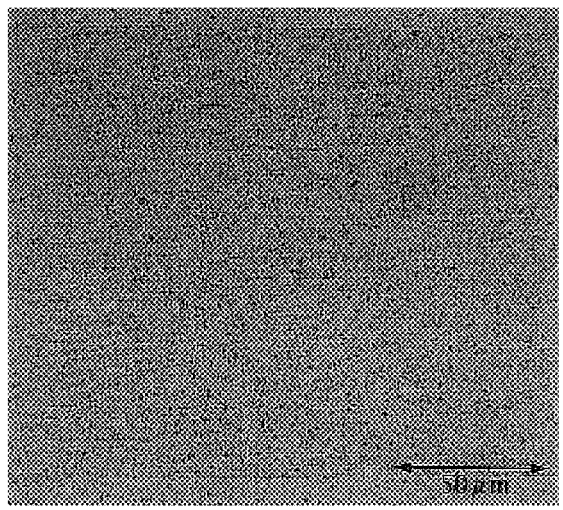
FIG. 8A is a photograph of an amorphous silicon film after heat treatment processing at 550° C. for 4 hours.
Figure 8B:
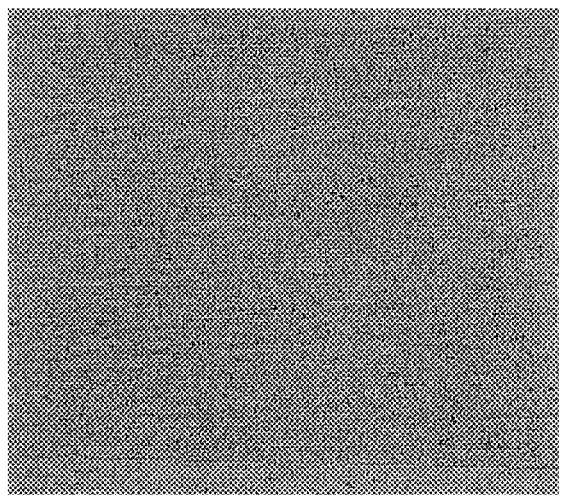
FIG. 8B is a photograph of an amorphous silicon film after heat treatment processing at 575° C. for 4 hours.
Figure 8C:
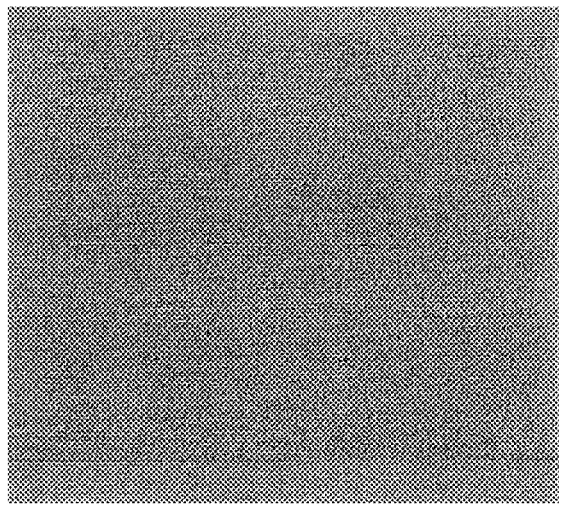
FIG. 8C is a photograph of an amorphous silicon film after heat treatment processing at 600° C. for 4 hours.
Figure 9A:
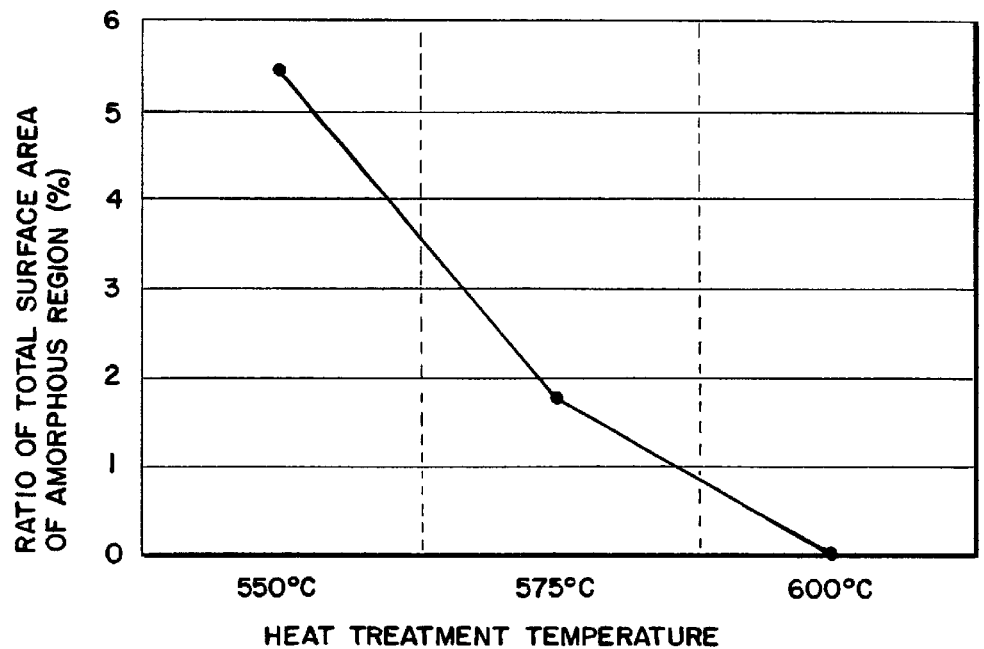
FIGS. 9A and 9B are probable statistical distribution diagrams of the amorphous regions of FIGS. 8A to 8C.
Figure 9B:
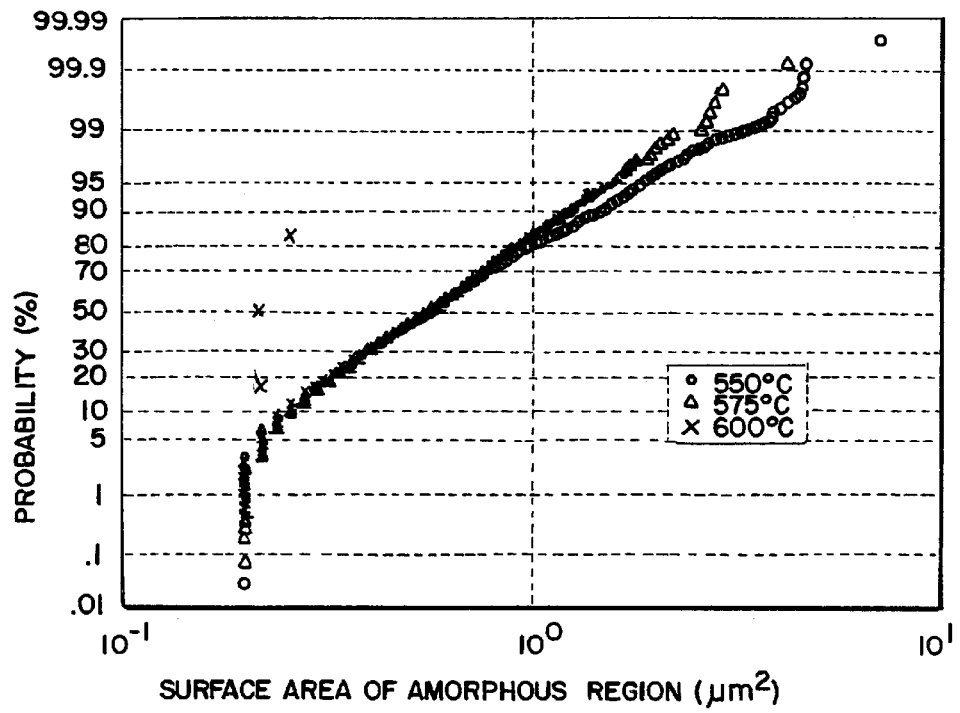
Figure 10A:
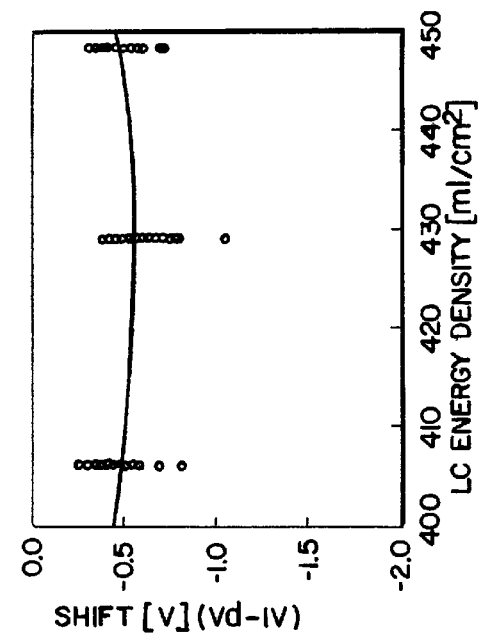
FIGS. 10A to 10D are diagrams expressing the electrical characteristics of an amorphous silicon film to which heat treatment processing has been performed at 550° C. for 4 hours, and to which laser annealing is performed at various laser powers.
Figure 10B:
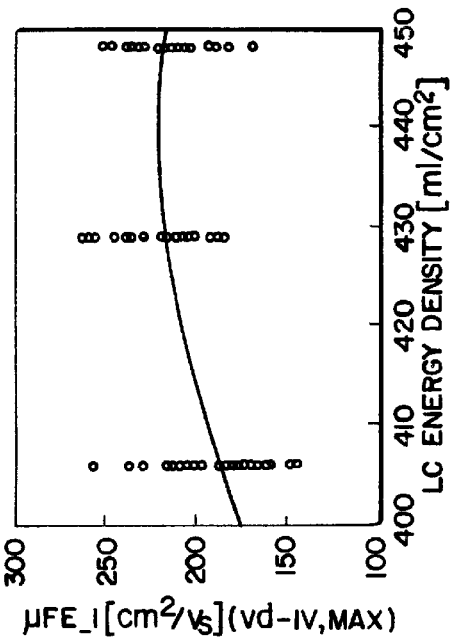
Figure 10C:
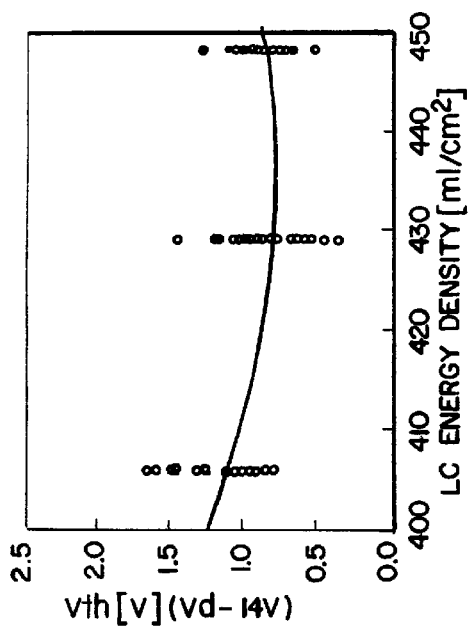
Figure 10D:
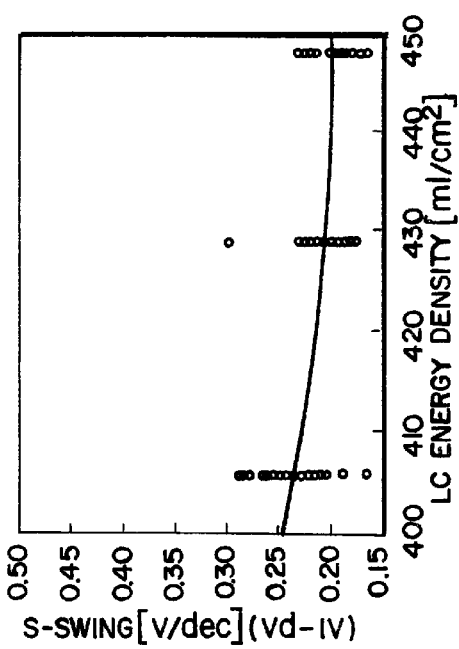
Figure 10E:
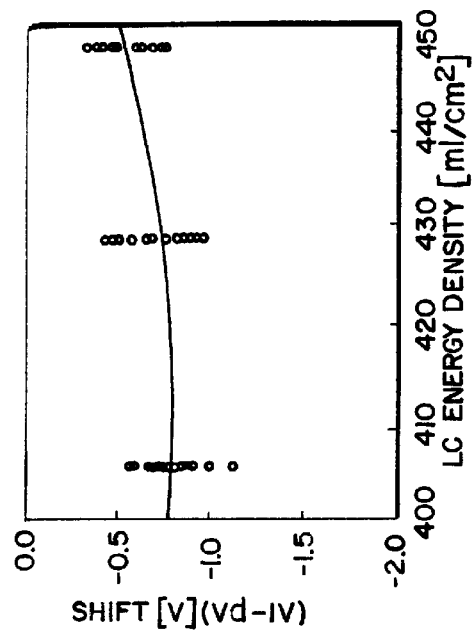
FIGS. 10E to 10H are diagrams expressing the electrical characteristics of an amorphous silicon film to which heat treatment processing has been performed at 575° C. for 4 hours, and to which laser annealing is performed at various laser powers.
Figure 10G:
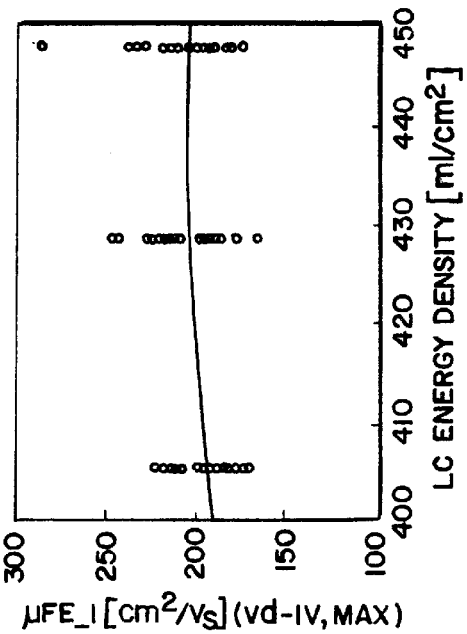
Figure 10F:
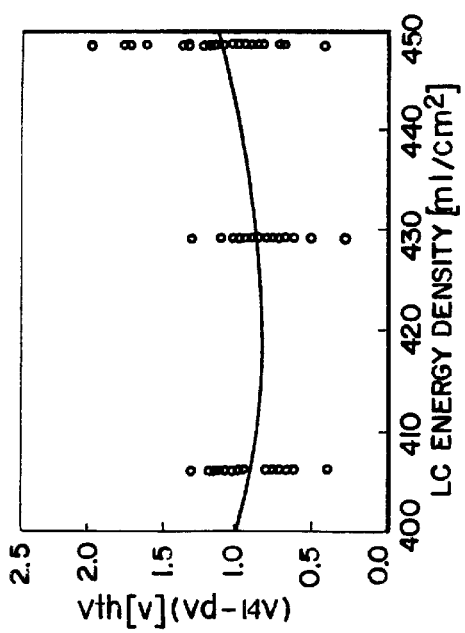
Figure 10H:
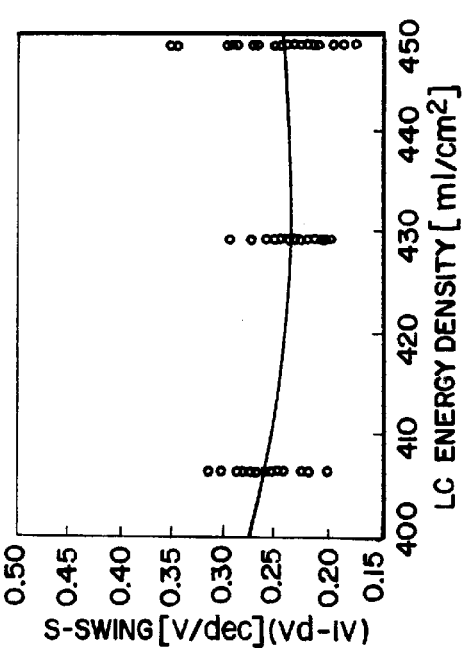
Figure 11A:
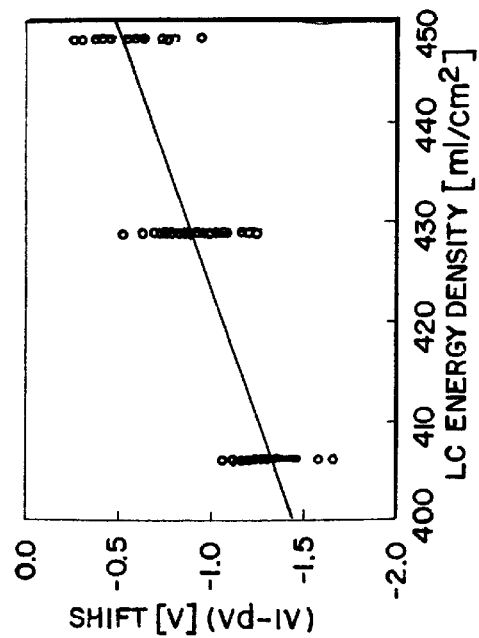
FIGS. 11A to 11D are diagrams expressing the electrical characteristics of an amorphous silicon film to which heat treatment processing has been performed at 600° C. for 4 hours, and to which laser annealing is performed at various laser powers.
Figure 11B:
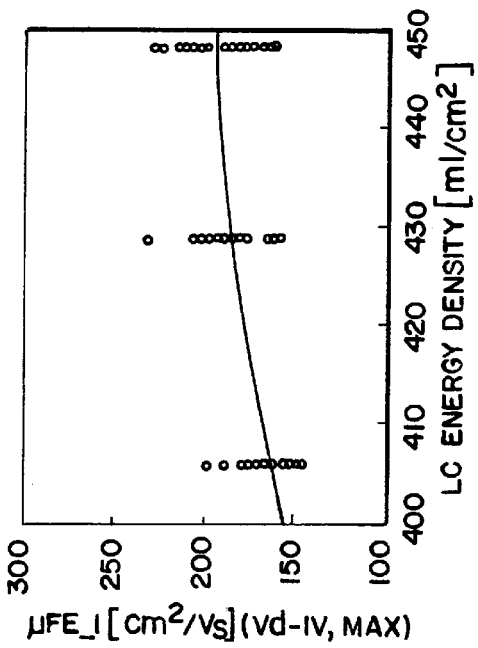
Figure 11C:
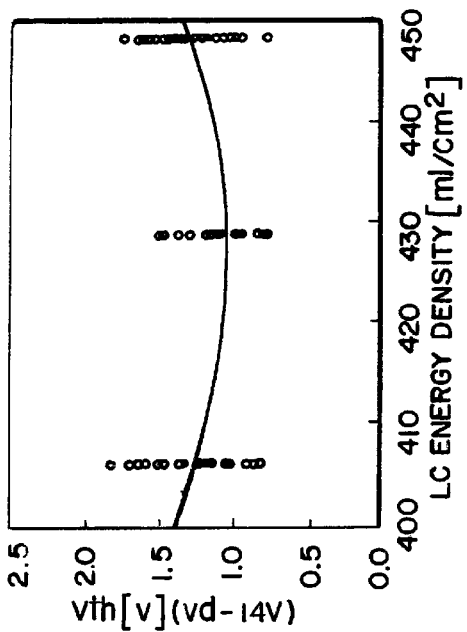
Figure 11D:
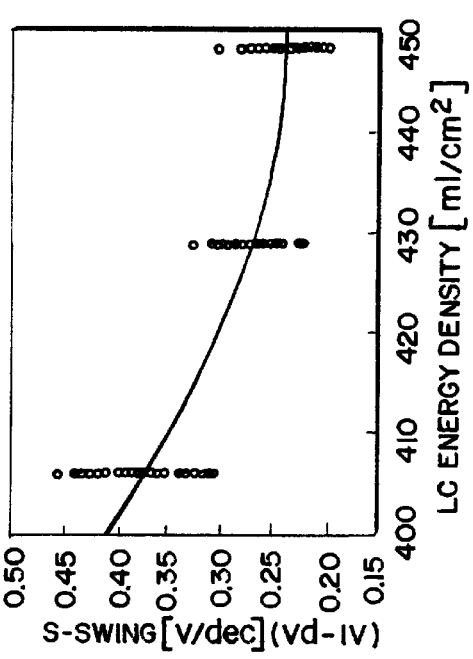

An embodiment mode of the present invention is explained.

First, a Corning #1737 substrate having a thickness of 0.7 mm and a diagonal of 5 inches is prepared. A 200 nm thick silicon nitride oxide film is formed on the substrate using a plasma CVD apparatus, and then a 50 nm thick amorphous silicon film is formed on the surface of the silicon nitride oxide film. A solution (volume 5 ml) containing 10 ppm by weight of an element for promoting crystallization is applied on the amorphous silicon film, and heat treatment of the substrate is performed in a nitrogen atmosphere for 1 hour at 500° C., and additionally for 4 hours at 550° C. A crystalline silicon film is obtained in which the total surface area of amorphous regions contained within a region which becomes an active layer of one TFT is from 1.0% to 8.0% with respect to the surface area of the active layer of one TFT in accordance with the heat treatment process. Further, this becomes a crystalline silicon film in which the surface area of each of the amorphous regions after partial crystallization by the heat treatment process is equal to or less than 10.0 $\mu m^2$, and in which at least one amorphous region having a surface area equal to or greater than 0.30 $\mu m^2$ exists.

An example of a structure of an optical system for processing the cross sectional shape of a laser beam into a linear shape on an irradiation surface is shown in FIG. 12. The structure is an extremely general one, and all optical systems conform to the structure of FIG. 12. The structure is one in which not only the cross sectional shape of the laser beam is transformed into a linear shape on the irradiation surface, but also one in which energy homogeneity is achieved on the irradiation surface at the same time.

The side face diagram of FIG. 12 is explained first. A laser beam emitted from a laser oscillator 1001 is divided in a direction normal to the movement direction of the laser beam by cylindrical lens arrays 1002a and 1002b. This direction is referred to as a vertical direction throughout this specification. The vertical direction is bent in the direction light is bent by a mirror when the mirror is placed within the optical system. There are four divisions with this structure. The divided laser beams are collected into a single laser beam by a cylindrical lens array 1004. This is then reflected by a mirror 1007, and once again condensed into one laser beam on an irradiation surface 1009 by a doublet cylindrical lens 1008. The doublet cylindrical lens refers to a lens composed of two cylindrical lenses. The linear laser beam is thus given energy uniformity in the width direction, and the length of the width direction is thus determined.

The top surface diagram of FIG. 12 is explained next. The laser beam leaving from the laser oscillator 1001 is divided in a direction normal to the movement direction of the laser beam, and normal to the vertical direction, by a cylindrical lens array 1003. This direction is referred to as a horizontal direction throughout this specification. The horizontal direction is bent in the direction light is bent by a mirror when the mirror is placed within the optical system. There are seven divisions with this structure. The laser beams are next made into a single beam on the irradiation surface 1009 by the cylindrical lens 1004. The linear laser beam is thus given energy uniformity in the length direction, and the length is thus determined. Lasers such as excimer lasers can be given as typical ones at present for use in the optical system.

Further, if a small output laser oscillator is used, there is not sufficient energy density to process the laser beam into a 10.0 cm long linear shape, for example. Thus, laser light is irradiated so as to cover the entire substrate surface by a point light source. A method of using a galvanometer for irradiation, for example, is used for such means. An example of an optical system for this method is shown in FIG. 13.

A laser beam emitted from a laser oscillator 1401 becomes a small size laser beam in accordance with a beam expander 1402, and in addition, reaches a substrate 1405 via a galvanometer 1403 and an f-θ lens 1404. A method of irradiating while covering the entire surface of the substrate using the galvanometer is explained. The position on the substrate at which the laser beam arrives is moved by rotation of the galvanometer 1403. A stage is moved in the direction denoted by reference numeral 1408 after the galvanometer 1403 completes one half rotation. Next, the position on the substrate at which the laser beam arrives is moved by rotation of the galvanometer 1403 in a direction which is the reverse of the previous direction, and when the galvanometer 1403 has finished one half revolution, the stage is moved in the direction denoted by reference numeral 1408. Irradiation can thus be performed so as to cover the entire surface of the substrate by repeating rotation of the galvanometer and movement of the stage. However, the focus is made to always be on the substrate, even if the irradiation position moves, in accordance with the f-θ lens 1404. Lasers such as the third harmonic of YAG lasers can be given as typical laser oscillators used in this type of optical system at present.

Laser annealing is performed on the crystalline semiconductor film having amorphous regions by using the above methods. The crystalline semiconductor film is crystallized to 99% or greater in the regions which become TFT active layers after laser annealing. Dispersion in the electrical characteristics of TFTs manufactured based on the crystalline semiconductor film is reduced.

Further, amorphous semiconductor films and microcrystalline semiconductor films exist as amorphous semiconductor films, and in addition to amorphous silicon films, compound semiconductor films having an amorphous structure, such as amorphous silicon germanium films, may also be applied.

Embodiment 1

A case of performing laser annealing using an XeCl excimer laser after performing heat treatment processing is explained in Embodiment 1.

A Corning #1737 substrate having a thickness of 0.7 mm and a diagonal of 5 inches is prepared. A 200 nm thick silicon nitride oxide film is formed on the substrate using a plasma CVD apparatus, and a 50 nm thick amorphous silicon film is formed on the surface of the silicon nitride oxide film. A solution containing an element for promoting crystallization is then applied on the amorphous silicon film. When using a nickel acetate solution, for example, the nickel acetate solution (concentration 10 ppm by weight, volume 5 ml) may be applied onto the entire surface of the film by spin coating.

Heat treatment is performed next for 1 hour at 500° C. in a nitrogen atmosphere, and additionally for 4 hours at 550° C. in a nitrogen atmosphere. The amorphous silicon film is partially crystallized by the heat treatment processing, and a crystalline silicon film is obtained in which the total surface area of amorphous regions contained within a region which becomes an active layer of one TFT becomes from 1.0% to 8.0% with respect to the surface area of the region which becomes the active layer of one TFT. Further, the crystalline silicon film is one in which the surface area of each of the amorphous regions is less than or equal to 10.0 $\mu m^2$ after partial crystallization by the heat treatment processing, and in which at least one amorphous region having a surface area equal to or greater than 0.30 $\mu m^2$ exists within the film. Laser annealing is performed next using a Lambda Corp. XeCl excimer laser L3308 (wavelength 308 nm, pulse width 30 nm). This laser oscillator emits a pulse emission laser, and possesses the ability to output energy of 500 mJ/pulse. The laser beam size is 10×30 mm at the end thereof (both values half-widths). The laser beam is processed into a linear shape laser through an optical system such as that of FIG. 12, and laser annealing is performed using the XeCl excimer laser. The crystalline silicon film is crystallized to 99% or greater in the regions which become TFT active layers after laser annealing.

Dispersion in the TFT electrical characteristics can be reduced if the crystalline silicon film thus manufactured is used as the TFT active layer.

Embodiment 2

A case of performing laser annealing using an KrF excimer laser after performing heat treatment processing is explained in Embodiment 2.

A silicon nitride oxide film and an amorphous silicon film are formed by a method similar to that of Embodiment 1, and a solution containing an element for promoting crystallization is applied to the amorphous silicon film. Next, heat treatment is performed for 1 hour at 500° C. in a nitrogen atmosphere, and additionally for 4 hours at 550° C. in a nitrogen atmosphere. The amorphous silicon film is partially crystallized by the heat treatment processing, and a crystalline silicon film is obtained in which the total surface area of amorphous regions contained within a region which becomes an active layer of one TFT becomes from 1.0% to 8.0% with respect to the surface area of the region which becomes the active layer of one TFT. Further, the crystalline silicon film is one in which the surface area of each of the amorphous regions is equal to or less than 10.0 $\mu m^2$ after partial crystallization by the heat treatment processing, and in which at least one amorphous region having a surface area equal to or greater than 0.30 $\mu m^2$ exists within the film. Laser annealing is performed next by a method like that of FIG. 12 using the KrF excimer laser.

Dispersion in the TFT electrical characteristics can be reduced if the crystalline silicon film thus manufactured is used as the TFT active layer.

Embodiment 3

A case of performing laser annealing using an ArF excimer laser after performing heat treatment processing is explained in Embodiment 3.

A silicon nitride oxide film and an amorphous silicon film are formed by a method similar to that of Embodiment 1, and a solution containing an element for promoting crystallization is applied to the amorphous silicon film. Next, heat treatment is performed for 1 hour at 500° C. in a nitrogen atmosphere, and additionally for 4 hours at 550° C. in a nitrogen atmosphere. The amorphous silicon film is partially crystallized by the heat treatment processing, and a crystalline silicon film is obtained in which the total surface area of amorphous regions contained within a region which becomes an active layer of one TFT becomes from 1.0% to 8.0% with respect to the surface area of the region which becomes the active layer of one TFT. Further, the crystalline silicon film is one in which the surface area of each of the amorphous regions is less than or equal to 10.0 $\mu m^2$ after partial crystallization by the heat treatment processing, and in which at least one amorphous region having a surface area equal to or greater than 0.30 $\mu m^2$ exists within the film. Laser annealing is performed next by a method like that of FIG. 12 using the ArF excimer laser. The crystalline silicon film is crystallized to 99% or greater in the regions which become TFT active layers after laser annealing.

Dispersion in the TFT electrical characteristics can be reduced if the crystalline silicon film thus manufactured is used as the TFT active layer.

Embodiment 4

A case of performing laser annealing using the third harmonic of a YAG laser after performing heat treatment processing is explained in Embodiment 4.

A silicon nitride oxide film and an amorphous silicon film are formed by a method similar to that of Embodiment 1, and a solution containing an element for promoting crystallization is applied to the amorphous silicon film. Next, heat treatment is performed for 1 hour at 500° C. in a nitrogen atmosphere, and additionally for 4 hours at 550° C. in a nitrogen atmosphere. The amorphous silicon film is partially crystallized by the heat treatment processing, and a crystalline silicon film is obtained in which the total surface area of amorphous regions contained within a region which becomes an active layer of one TFT becomes from 1.0% to 8.0% with respect to the surface area of the region which becomes the active layer of one TFT. Further, the crystalline silicon film is one in which the surface area of each of the amorphous regions is less than or equal to 10.0 $\mu m^2$ after partial crystallization by the heat treatment processing, and in which at least one amorphous region having a surface area equal to or greater than 0.30 $\mu m^2$ exists within the film. Laser annealing is performed next by a method like that of FIG. 13 using the third harmonic of the YAG laser. The crystalline silicon film is crystallized to 99% or greater in the regions which become TFT active layers after laser annealing.

Dispersion in the TFT electrical characteristics can be reduced if the crystalline silicon film thus manufactured is used as the TFT active layer.

Embodiment 5

A case of performing heat treatment processing at 575° C. when crystallizing an amorphous silicon film is explained in Embodiment 5.

A silicon nitride oxide film and an amorphous silicon film are formed by a method similar to that of Embodiment 1, and a solution containing an element for promoting crystallization is applied to the amorphous silicon film. Next, heat treatment is performed for 1 hour at 500° C. in a nitrogen atmosphere, and additionally for 4 hours at 575° C. in a nitrogen atmosphere. The amorphous silicon film is partially crystallized by the heat treatment processing, and a crystalline silicon film is obtained in which the total surface area of amorphous regions contained within a region which becomes an active layer of one TFT becomes from 1.0% to 8.0% with respect to the surface area of the region which becomes the active layer of one TFT. Further, the crystalline silicon film is one in which the surface area of each of the amorphous regions is less than or equal to 10.0 $m^2$ after partial crystallization by the heat treatment processing, and in which at least one amorphous region having a surface area equal to or greater than 0.30 $\mu m^2$ exists within the film.

Laser annealing is performed next in order to increase the crystallinity of the crystalline silicon film. The crystalline silicon film is crystallized to 99% or greater in the regions which become TFT active layers after laser annealing. Dispersion in the TFT electrical characteristics can be reduced if the crystalline silicon film thus manufactured is used as the TFT active layer.

Embodiment 6

Embodiment 6 is explained with reference to FIGS. 14A to 20. A method of manufacturing a pixel TFT of a display region, and a driver circuit TFT formed in the periphery of the display region, on the same substrate, and a display device using such are explained in detail here in accordance with manufacturing processes. Note that, for simplicity of explanation, a CMOS circuit, which is a basic circuit for circuits such as a shift register circuit and a buffer circuit; and an n-channel TFT for forming a sampling circuit are shown in the figures.

A low alkaline glass substrate or a quartz substrate can be used for a substrate 1500 in FIG. 14A. A low alkaline glass substrate is used in Embodiment 6. In order to prevent impurity diffusion from the substrate 1500, a base film 1501 is formed of a film such as a silicon oxide film, a silicon nitride film or a silicon nitride oxide film on the surface of the substrate 1500 on which TFTs will be formed. For example, a 100 nm thick silicon nitride oxide film manufactured from $SiH_4$, $NH_3$, and $N_2O$ by plasma CVD, and a 200 nm thick silicon nitride oxide film similarly manufactured from $SiH_4$ and $N_2O$ are laminated.

A semiconductor film 1503a having an amorphous structure is formed having a thickness of 20 to 150 nm (preferably from 30 to 80 nm) by using a known method such as plasma CVD or sputtering. A 55 nm thick amorphous silicon film is formed by plasma CVD here. Amorphous semiconductor films and microcrystalline semiconductor films exist as semiconductor films having an amorphous structure, and compound semiconductor films having an amorphous structure such as amorphous silicon germanium films may also be applied. Further, it is possible to form the base film 1501 and the amorphous silicon film 1503a by the same film formation method, and therefore both films may be formed in succession. It becomes possible to prevent contamination of the surfaces after forming the base film by not having any exposure to the atmosphere, and dispersion in the characteristics of the manufactured TFTs, and fluctuations in the threshold voltages, can be reduced. (See FIG. 14A.)

Heat treatment is performed next using a metallic element for promoting crystallization (an element, or a plurality of elements, selected from the group consisting of nickel, cobalt, germanium, tin, lead, palladium, iron, and copper; typically nickel) on the amorphous silicon film 1503a, thus performing crystallization. The amorphous silicon film is partially crystallized by the heat treatment processing, to obtain a crystalline silicon film in which the total surface area of amorphous regions contained within a region which becomes an active layer of one TFT becomes from 1.0% to 8.0% with respect to the surface area of the region which becomes the active layer of one TFT. Further, the crystalline silicon film is one in which the surface area of each of the amorphous regions is less than or equal to 10.0 $\mu m^2$ after partial crystallization by the heat treatment processing, and in which at least one amorphous region having a surface area equal to or greater than 0.30 $\mu m^2$ exists within the film. (See FIG. 14B.) Laser crystallization is performed next, forming a crystalline silicon film 1503b. The crystalline silicon film is crystallized to 99% or greater in the regions which become TFT active layers after laser annealing. Although depending upon the amount of hydrogen contained within the amorphous silicon film, it is preferable to perform heat treatment at a temperature of 400 to 500° C. for on the order of 1 hour, reducing the amount of contained hydrogen to 5 atom % or less, before the crystallization process. (See FIG. 14C.)

The crystalline silicon film 1503b is then divided into island shapes, forming island shape semiconductor layers 1504 to 1507. A mask layer 1508 is formed next from a silicon oxide film having a thickness of 50 to 100 nm by using plasma CVD or sputtering. (See FIG. 14D.)

A resist mask 1509 is then formed, and boron (B) is added as an impurity element which imparts p-type conductivity at a concentration of $1\times10^{16}$ to $5\times10^{17}$ atoms/cm$^3$ to the entire surface of the island shape semiconductor layers 1504 to 1507, which form n-channel TFTs, with the aim of controlling the threshold voltages. An ion doping method may be implemented for the addition of boron (B), and boron may also be added at the same time as film formation of the amorphous silicon film. It is not always necessary to add boron (B) here, but it is preferable to form boron added semiconductor layers 1510 to 1512 in order to keep the n-channel TFT threshold voltages within a predetermined range. (See FIG. 14E.)

In order to form LDD regions in the n-channel TFTs of the driver circuit, an impurity element which imparts n-type conductivity is selectively added to the island shape semiconductor layers 1510 and 1511. Resist masks 1513 to 1516 are therefore formed in advance. Phosphorous (P) and arsenic (As) may be used as the n-type conductivity imparting impurity element, and an ion doping method is applied here using phosphine ($PH_3$) so as to add phosphorous (P). The concentration of phosphorous (P) in impurity regions 1517 and 1518 formed may be set within a range of $2\times10^{16}$ to $5\times10^{19}$ atoms/cm$^3$. The concentration of the n-type conductivity imparting impurity element in the regions 1517 and 1518, and in an impurity region 1519, formed here is denoted by reference symbol n throughout this specification. Further, the impurity region 1519 is a semiconductor layer for forming a storage capacitor of a pixel portion, and phosphorous (P) is added to this region at the same concentration. (See FIG. 15A.)

The mask layer 1508 is removed next by using a means such as hydrogen fluoride, and a process of activating the impurity elements added by FIG. 14E and FIG. 15A is performed. Activation can be performed by heat treatment for 1 to 4 hours at a temperature of 500 to 600° C. in a nitrogen atmosphere, or by a laser activation method. Further, both may be performed together. A KrF excimer laser beam (wavelength 248 nm) is used in Embodiment 6. The laser beam is formed into a linear shape laser having an emission frequency of 5 to 50 Hz and an energy density of 100 to 500 mJ/cm$^2$, and this is scanned at an overlap ratio from 80 to 98%, processing the entire surface of the substrate on which the island shape semiconductor layers are formed. Note that there are no limitations on the irradiation conditions of the laser beam, and these conditions may be suitably determined by the operator.

A gate insulating film 1520 is then formed by plasma CVD or sputtering from an insulating film containing silicon and having a thickness of 10 to 150 nm. For example, a 120 nm thick silicon nitride oxide film is formed. Another insulating film containing silicon may also be used in either a single layer structure or a lamination structure for the gate insulating film. (See FIG. 15B.)

A first conductive layer is formed next in order to form a gate electrode. The first conductive layer may be formed by a single layer, and when necessary, may also have a two layer or a three layer lamination structure. A conductive layer (A) 1521 made of a conducting metal nitride film, and a conductive layer (B) 1522 made of a metallic film are laminated in Embodiment 6. The conductive layer (B) 1522 is formed from an element selected from the group consisting of tantalum (Ta), titanium (Ti), molybdenum (Mo), and tungsten (W), from an alloy having one of the above elements as its main constituent, or from an alloy film of the above elements (typically an Mo—W alloy film or an Mo—Ta alloy film). The conductive layer (A) 1521 may be formed from a tantalum nitride (TaN) film, a tungsten nitride (WN) film, a titanium nitride (TiN) film, or a molybdenum nitride (MoN) film. Further, tungsten silicide, titanium silicide, or molybdenum silicide may also be applied as a substitute material for the conductive layer (A) 1521. It is preferable to reduce the concentration of impurity elements contained within the conductive layer (B) in order to achieve low resistance, and in particular, it is preferable that the oxygen concentration be made less than or equal to 30 ppm. For example, a low resistivity value equal to or less than 20 $\Omega$Wcm can be realized with a tungsten (W) film by keeping the oxygen concentration to 30 ppm or less.

The conductive layer (A) 1521 may have a thickness set from 10 to 50 nm (preferably between 20 and 30 nm), and the conductive layer (B) 1522 may have a thickness set from 200 to 400 nm (preferably between 250 and 350 nm). A 30 nm thick tantalum nitride film is used in the conductive layer (A) 1521, and a 350 nm thick Ta film is used in the conductive layer (B) 1522 in Embodiment 6, and both are formed by sputtering. With film formation in accordance with sputtering, if a suitable amount of Xe or Kr is added to the sputtering gas Ar, then the internal stress of the film to be formed is relieved and film peeling can be prevented. Note that, although not shown in the figures, it is effective to form a phosphorous (P) doped silicon film having a thickness on the order of 2 to 20 nm under the conductive layer (A) 1521. Thus, adhesion of the conducting films formed on the silicon film can be increased, and oxidation can be prevented, and at the same time diffusion of minute amounts of alkaline metal elements contained within the conductive layer (A) or the conductive layer (B) into the gate insulating film 1520 can be prevented. (See FIG. 15C.)

Resist masks 1523 to 1527 are formed next, and the conductive layer (A) 1521 and the conductive layer (B) 1522 are etched in one shot, forming gate electrodes 1528 to 1531 and a capacitor wiring 1532. The gate electrodes 1528 to 1531 and the capacitor wiring 1532 are formed from the integration of regions denoted by reference numerals 1528a to 1532a made from the conductive layer (A), and regions denoted by reference numerals 1528b to 1532b made from the conductive layer (B). The gate electrodes 1529 and 1530 formed in the driver circuit are formed at this time so as to overlap with a portion of the impurity regions 1517 and 1518 through the gate insulating film 1520. (See FIG. 15D.)

Next, a process of adding an impurity element which imparts p-type conductivity is performed in order to form source regions and drain regions of the driver circuit p-channel TFTs. The impurity regions are formed in a self-aligning manner using the gate electrode 1528 as a mask here. The regions in which the n-channel TFTs are formed are covered by a resist mask 1533 at this point. An impurity region 1534 is then formed by ion doping using diborane ($B_2H_6$). The boron (B) concentration of this region is set so as to be from $3\times10^{20}$ to $3\times10^{21}$ atoms/cm$^3$. The concentration of the p-type conductivity imparting impurity element in the impurity region 1534 formed here is denoted by reference symbol p$^+$ throughout this specification. (See FIG. 16A.)

Formation of impurity regions which function as source regions or drain regions is performed next in the n-channel TFTs. Resist masks 1535 to 1537 are formed, and an impurity element which imparts n-type conductivity is added, forming impurity regions 1538 to 1542. This is performed by ion doping using phosphine (PH$_3$), and the phosphorous (P) concentration of these regions is set from $1\times10^{20}$ to $1\times10^{21}$ atoms/cm$^3$. The concentration of the n-type conductivity imparting impurity element in the impurity regions 1538 to 1542 formed here is denoted by reference symbol n$^+$ throughout this specification. (See FIG. 16B.)

phosphorous (P) or boron (B) is already added to the impurity regions 1538 to 1542 in the previous step, but phosphorous (P) is added here at a sufficiently high concentration to the impurity regions, and therefore it can be considered that the phosphorous (P) or boron (B) added in the previous step does not have any influence. Further, the concentration of phosphorous (P) added to the impurity region 1538 is from 1/3 to 1/2 of the boron (B) concentration added in FIG. 17A, and therefore the p-type conductivity is maintained, and there is no influence imparted to the characteristics of the TFTs.

A process of adding an impurity which imparts n-type conductivity is then performed in order to form LDD regions in the n-channel TFTs of the pixel portion. An impurity element which imparts n-type conductivity is added by ion doping in a self-aligning manner with the gate electrode 1531 as a mask. The concentration of added phosphorous (P) is from $1\times10^{16}$ to $5\times10^{18}$ atoms/cm$^3$. Phosphorous is added at a lower concentration than the concentration of the impurity elements added by FIG. 15A, FIG. 16A, and FIG. 16B, and effectively, therefore, only impurity regions 1543 and 1544 are formed. The concentration of the n-type conductivity imparting impurity element in the impurity regions 1543 and 1544 is denoted by reference symbol n$^{--}$ throughout this specification. (See FIG. 16C.)

A heat treatment process is performed next in order to activate the impurity elements which impart n-type conductivity or p-type conductivity and which have been added at various concentrations. Furnace annealing, laser annealing, or rapid thermal annealing (RTA) can be performed for this process. The activation process is performed by a furnace annealing method here. Heat treatment is performed within a nitrogen atmosphere with an oxygen concentration equal to or less than 1 ppm, preferably equal to or less than 0.1 ppm, and at a temperature of 400 to 800° C., typically between 500 and 600° C. Heat treatment is performed at 550° C. for 4 hours in Embodiment 6. Further, for cases in which a substrate having heat resistance, such as a quartz substrate, is used for the substrate 1500, heat treatment may be performed for 1 hour at 800° C., performing activation of the impurity elements and forming a good junction between the impurity regions, to which the impurity elements are added, and channel forming regions.

Conductive layers (C) 1528c to 1532c are formed in the surfaces of the metallic films 1528b to 1532b, which form the gate electrodes 1528 to 1531 and the capacitor wiring 1532, to a depth of between 5 and 80 nm by this heat treatment process. For example, when the conductive layers (B) 1528b to 1532b are tungsten (W), tungsten nitride (WN) is formed, while tantalum nitride (TaN) is formed when tantalum (Ta) is used in the conductive layers (B). Further, the conductive layers (C) 1528c to 1532c can similarly be formed by exposing the gate electrodes 1528 to 1531 to a plasma atmosphere containing nitrogen in which a gas such as nitrogen or ammonia is used. In addition, heat treatment is performed for 1 to 12 hours at 300 to 450° C. in an atmosphere containing between 3 and 110% hydrogen, performing hydrogenation of the island shape semiconductor layers. This process is one of terminating dangling bonds in the semiconductor layers by thermally excited hydrogen. Plasma hydrogenation (using hydrogen which is excited by a plasma) may also be performed as another means of hydrogenation. (See FIG. 16D.)

Note that when the island shape semiconductor layers are manufactured by a method of crystallizing an amorphous silicon film using a metallic element, as in Embodiment 6, a minute amount of the metallic element remains within the island shape semiconductor layers. It is of course possible to complete the TFTs in this state, but it is preferable to remove the remaining metallic element from at least the channel forming regions. A means which utilizes the gettering action by phosphorous (P) is one means of removing the metallic element. The phosphorous (P) concentration required for gettering is on the same order as that of the impurity regions $n^+$ formed in FIG. 16B, and the metallic element can be gettered from the channel forming regions of the n-channel TFTs and the p-channel TFTs in accordance with the heat treatment activation process shown in FIG. 16D.

Furthermore, there are also other means of removing the metallic element, and there are no particular limitations on which means is used. After forming the island shape semiconductor layers, for example, heat treatment may be performed for between 10 minutes and 4 hours (preferably between 30 minutes and 1 hour) such that the temperature of the crystalline semiconductor films in which the metallic element remains is 800 to 1150° C. (preferably from 900 to 1000° C.) in an atmosphere containing between 3 and 10% by volume of hydrogen chloride with respect to an oxygen atmosphere. The nickel within the crystalline semiconductor films becomes a volatile chloride compound (nickel chloride) by this process, and is separated into the processing atmosphere. Namely, it becomes possible to remove the nickel in accordance with the gettering action of the halogen element.

After completing the activation and hydrogenation processes, a second conductive film which becomes gate wirings is formed. The second conductive film may be formed from a conductive layer (D) having a low resistance material such as aluminum (Al) or copper (Cu) as its main constituent, and from a conductive layer (E) made from titanium (Ti), tantalum (Ta), tungsten (W), or molybdenum (Mo). An aluminum (Al) film containing from 0.1 to 2% by weight of titanium (Ti) is used as a conductive layer (D) 1545, and a titanium (Ti) film is used as a conductive layer (E) 1546. The conductive layer (D) 1545 may be given a thickness from 200 to 400 nm (preferably between 250 and 350 nm), while the conductive layer (E) 1546 may be formed with a thickness of 50 to 200 nm (preferably between 100 and 150 nm). (See FIG. 17A.)

The conductive layer (E) 1546 and the conductive layer (D) 1545 are then etched in order to form gate wirings for connecting to the gate electrodes, forming gate wirings 1547 and 1548, and a capacitor wiring 1549. The gate wirings can be formed while maintaining good selectivity in processing with the base by using an etching process in which: first, the material from the surface of the conductive layers (E) to partway through the conductive layer (D) is removed by dry etching using a mixed gas of $SiCl_4$, $Cl_2$ and $BCl_3$; and then the remainder of the conductive layer (D) is removed by wet etching using a phosphoric acid etching solution. (See FIG. 17B.)

A first interlayer insulating film 1550 is formed of a silicon oxide film or a silicon nitride oxide film having a thickness of 500 to 1500 nm, and contact holes are formed next for reaching the source regions or the drain regions formed in each of the island shape semiconductor layers. Source wirings 1551 to 1554, and drain wirings 1555 to 1558 are then formed. Although not shown in the figures, in Embodiment 6, a three layer structure lamination film in which a 100 nm thick Ti film, a 300 nm thick aluminum film containing Ti, and a 150 nm thick Ti film are formed in succession by sputtering is adopted for these electrodes.

Next, a silicon nitride film, a silicon oxide film, or a silicon nitride oxide film is formed with a thickness of 50 to 500 nm (typically between 100 and 300 nm) as a passivation film 1559. A preferable result can be obtained with respect to raising the TFT characteristics if a hydrogenation process is performed in this state. For example, heat treatment may be performed for 1 to 12 hours at 300 to 450° C. in an atmosphere containing between 3 and 100% hydrogen. Alternatively, a similar result can be obtained by using a plasma hydrogenation method. Note that an opening portion may be formed in the passivation film 1559 at this point in a position at which a contact hole for later connecting a pixel electrode to a drain wiring is formed. (FIG. 17C.)

A second interlayer insulating film 1560 is formed next from an organic resin having a thickness of 1.0 to 1.5 $\mu$m. Materials such as polyimide, acrylic, polyamide, polyimide amide, and BCB (benzocyclobutene) can be used as the organic resin. Here, using a thermal setting type polyimide after application to the substrate, the substrate is fired at 300° C. A contact hole for reaching the drain wiring 1558 is then formed in the second interlayer insulating film 1560, and pixel electrodes 1561 and 1562 are formed. A transparent conductive film may be used for the pixel electrodes for a transmitting type liquid crystal display device, while a metallic film may be used for a case of a reflecting type liquid crystal display device. A transmitting type liquid crystal display device is manufactured in Embodiment 6, and therefore a conductive oxide film (ITO film) made of an indium oxide and tin oxide compound is formed to a thickness of 100 nm by sputtering. (See FIG. 18.)

The substrate having the driver circuit TFTs and pixel TFTs of the display region on the same substrate can thus be completed. A p-channel TFT 1601, a first n-channel TFT 1602, and a second n-channel TFT 1603, are formed in the driver circuit, and a pixel TFT 1604 and a storage capacitor 1605 are formed in the display region. For convenience, this type of substrate is referred to as an active matrix substrate in this specification.

Note that FIG. 19 is a top surface diagram showing a nearly one pixel portion of the display region. Across sectional structure along the line A–A' shown by FIG. 19 corresponds to the cross sectional diagram of the display region shown in FIG. 18. Further, FIG. 19 corresponds to the cross sectional diagrams of FIG. 14A to FIG. 18, and therefore common reference numerals are used. The gate wiring 1548 intersects with the semiconductor layer 1507 below, through a gate insulating film not shown in the figures. A source region, a drain region, and an Loff region, which is an $n^{--}$ region, are formed in the semiconductor layer, although not shown in the figures. Further, reference numeral 1563 denotes a contact portion between the source wiring 1554 and a source region 1624, reference numeral 1564 denotes a contact portion between the drain wiring 1558 and a drain region 1626, and reference numeral 1565 denotes a contact portion between the drain wiring 1558 and the pixel electrode 1561. The storage capacitor 1605 is formed by a region in which a semiconductor layer 1627, extending from the drain region 1626 of the pixel TFT 1604, overlaps with the capacitor wirings 1532 and 1549 through the gate insulating film.

Further, the p-channel TFT 1601 of the driver circuit has a channel forming region 1606, source regions 1607a and 1607b, and drain regions 1608a and 1608b in the island shape semiconductor layer 1504. The first n-channel TFT 1602 has a channel forming region 1609, an LDD region 1610 overlapping with the gate electrode 1529 (this type of LDD region is hereafter referred to as Lov), a source region 1611, and a drain region 1612 in the island shape semiconductor layer 1505. The length of the Lov region in the longitudinal direction of the channel is from 0.5 to 3.0 $\mu$m, preferably between 1.0 and 1.5 $\mu$m. The second n-channel TFT 1603 has a channel forming region 1613, LDD regions 1614 and 1615, a source region 1616, and a drain region 1617 in the island shape semiconductor layer 1506. An Lov region and an LDD region which does not overlap with the gate electrode 1530 (this type of LDD region is hereafter referred to as an Loff) are formed in the LDD region, and the length of the Loff region in the channel longitudinal direction is from 0.3 to 2.0 $\mu$m, preferably between 0.5 and 1.5 $\mu$m. The pixel TFT 1604 has channel forming regions 1618 and 1619, Loff regions 1620 to 1623, and source or drain regions 1624 to 1626 in the island shape semiconductor layer 1507. The length of the Loff regions in the longitudinal direction of the channel is from 0.5 to 3.0 $\mu$m, preferably between 1.5 and 2.5 $\mu$m. In addition, the storage capacitor 1605 is formed from the capacitor wirings 1532 and 1549, an insulating film made from the same material as the gate insulating film, and the semiconductor layer 1627 which is connected to the drain region 1626 of the pixel TFT 1604 and to which an impurity element which imparts n-type conductivity is added. Further, it is not necessary to limit the present invention to the structure of the storage capacitor shown in Embodiment 6. For example, a storage capacitor having the structure recorded in Japanese Patent Application No. Hei 9-316567, Japanese Patent Application No. Hei 9-273444, or Japanese Patent Application No. Hei 10-254097, all by the applicant of the present invention, can also be used.

The pixel TFT 1604 is of a double gate structure in FIG. 18, but a single gate structure may also be used, and a multi-gate structure in which a plurality of gate electrodes are formed may also be used without hindrance.

Figure 20:
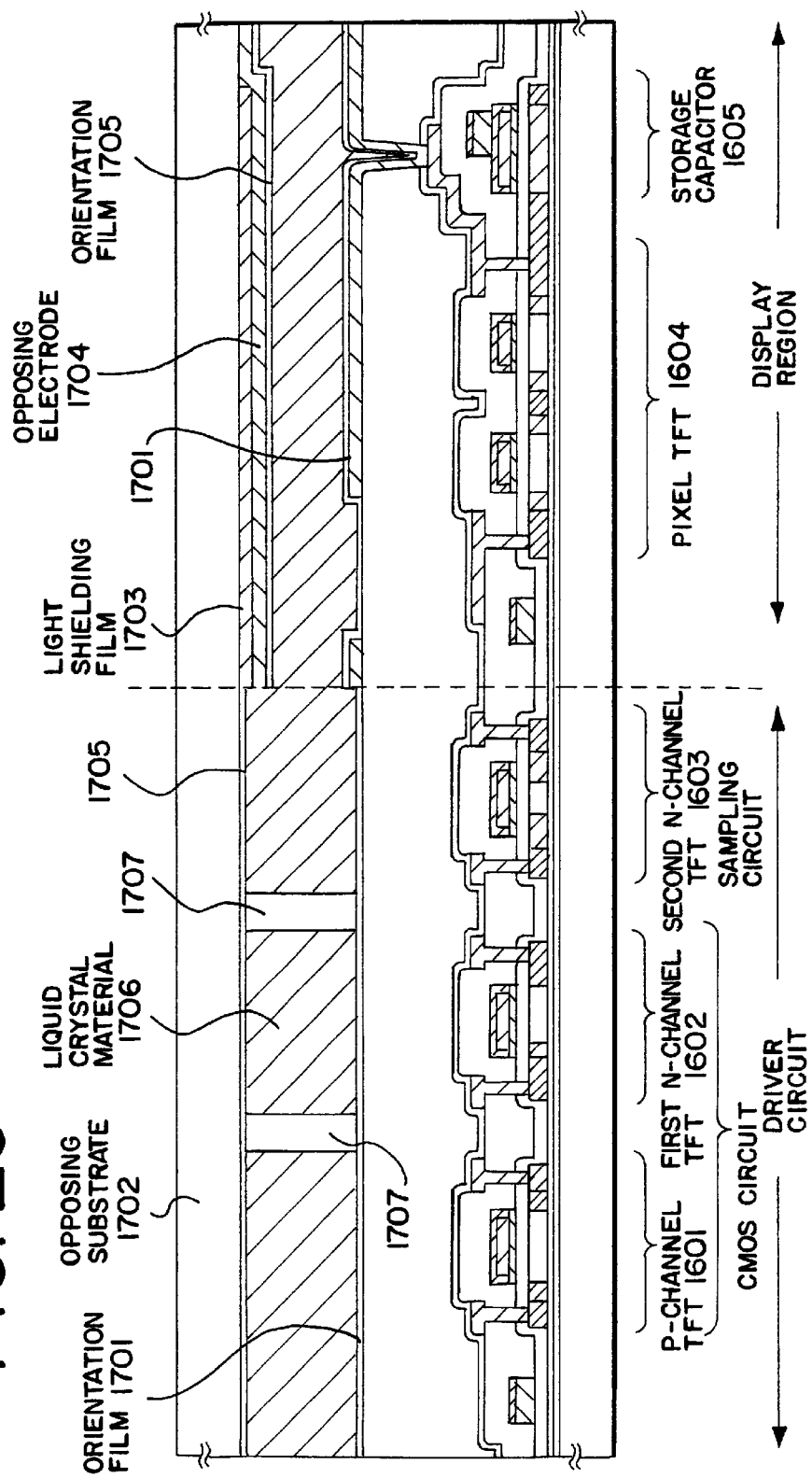
FIG. 20 is a diagram showing a cross sectional structure of a liquid crystal display device.

A process of manufacturing an active matrix type liquid crystal display device from the above-stated active matrix substrate is explained. As shown in FIG. 20, an orientation film 1701 is formed with respect to the active matrix substrate manufactured by the above method in the state of FIG. 18. Polyimide resin is often used in an orientation film of a normal liquid crystal display element. A light shielding film 1703, an opposing electrode 1704, and an orientation film 1705 are formed in an opposing substrate 1702. A rubbing process is performed after forming the orientation film so as to give the liquid crystal molecules a certain, fixed pre-tilt angle. The active matrix substrate, on which the pixel portion and the CMOS circuit are formed, and the opposing substrate are then joined through a means such as a sealing material (not shown in the figure) and columnar spacers 1707, in accordance with a known cell construction process. A liquid crystal material 1706 is then injected between both of the substrates, and this is completely sealed by using a sealant (not shown in the figure). A known liquid crystal material may be used for the liquid crystal material. The active matrix type liquid crystal display device shown in FIG. 20 is thus completed.

The above active matrix type liquid crystal display device, in which the structure of the TFTs of each circuit is optimized based upon the specifications required by the pixel TFT and the driver circuit, can thus be manufactured.

Note that it is possible to freely combine Embodiment 6 with any of Embodiments 1 to 5, Embodiment 7, and Embodiment 8.

Embodiment 7

An example of using another method of crystallization as a substitute for the crystallization method in Embodiment 6 is explained below in Embodiment 7 with reference to FIGS. 21A to 21C.

The state of FIG. 21A is first obtained in accordance with Embodiment 6. Note that FIG. 21A corresponds to FIG. 14A.

Crystallization is performed next using a metallic element for promoting crystallization (one element, or a plurality of elements, selected from the group consisting of nickel, cobalt, germanium, tin, lead, palladium, iron, and copper, typically nickel). Specifically, crystallization is performed in accordance with heat treatment in a state in which the metallic element is maintained on the surface of the amorphous silicon film (not shown in the figures). The amorphous silicon film is partially crystallized, and the crystalline silicon film, in which the total surface area of amorphous regions contained within a region which becomes an active layer of one TFT is from 1.0% to 8.0% with respect to the surface area of the region which becomes the active layer of one TFT, is obtained in accordance with the heat treatment process. Further, this becomes the crystalline silicon film in which the surface area of each of the amorphous regions after partial crystallization by the heat treatment process is equal to or less than 10.0 $\mu m^2$, and in which at least one amorphous region having a surface area greater than or equal to 0.30 $\mu m^2$ exists. Laser annealing is performed next, changing into the crystalline silicon film. A metallic element containing layer 1801, in which an aqueous solution containing nickel (a nickel acetate aqueous solution) is introduced by sputtering, is formed on the entire surface of the amorphous semiconductor film 1503a. (See FIG. 21B.) Further, although sputtering is used as the method of introducing nickel in Embodiment 7, a means of forming a thin film of a metallic element (a nickel film in Embodiment 7) on the amorphous semiconductor film by evaporation or the like may also be used.

Laser annealing is performed next, forming a crystalline silicon film 1802. (See FIG. 21C.) After laser annealing, the crystalline silicon film is crystallized to 99% or greater in the regions which become the TFT active layers.

Subsequent processes may be performed in accordance with the steps of Embodiment 6 from FIG. 14C, obtaining the structure shown in FIG. 20.

Note that when the island shape semiconductor layers are manufactured by a method of crystallizing an amorphous silicon film using a metallic element, as in Embodiment 7, a minute amount of the metallic element remains within the island shape semiconductor layers. It is of course possible to complete the TFTs in this state, but it is preferable to remove the remaining metallic element from at least the channel forming regions. A means which utilizes the gettering action by phosphorous (P) is one means of removing the metallic element. The phosphorous (P) concentration required for gettering is on the same order as that of the impurity regions n⁺ formed by FIG. 17B, and the metallic element can be gettered from the channel forming regions of the n-channel TFTs and the p-channel TFTs in accordance with the heat treatment activation process shown in FIG. 16D.

Furthermore, there are also other means of removing the metallic element, and there are no particular limitations on which means is used. After forming the island shape semiconductor layers, heat treatment may be performed, for example, for between 10 minutes and 4 hours (preferably between 30 minutes and 1 hour) such that the temperature of the crystalline semiconductor films in which the metallic element remains is 800 to 1150° C. (preferably from 900 to 1000° C.) in an atmosphere containing between 3 and 10% by volume of hydrogen chloride with respect to an oxygen atmosphere. The nickel within the crystalline semiconductor films becomes a volatile chloride compound (nickel chloride) by this process, and is separated into the processing atmosphere. Namely, it becomes possible to remove the nickel in accordance with the gettering action of the halogen element.

Further, a plurality of means may be used for removing the metallic element. Gettering may also be performed before forming the island shape semiconductor layers.

Embodiment 8

An example of using another method of crystallization as a substitute for the crystallization method in Embodiment 7 is explained below in Embodiment 8 with reference to FIGS. 22A to 22D.

The state of FIG. 22A is first obtained in accordance with Embodiment 6. Note that FIG. 22A corresponds to FIG. 14A.

An aqueous solution containing a metallic element (nickel in Embodiment 8) (nickel acetate aqueous solution) is then applied by spin coating, forming a metallic element containing layer 1901 over the entire surface of the amorphous semiconductor film 1503a. (See FIG. 22B.) Metallic elements capable of being used here are, in addition to nickel (Ni), germanium (Ge), iron (Fe), palladium (Pd), tin (Sn), lead (Pb), cobalt (Co), platinum (Pt), copper (Cu), gold (Au), and aluminum (Al).

Further, a method of adding nickel by spin coating is used in Embodiment 8, but a means of forming a thin film of a metallic element (a nickel thin film in Embodiment 8) on the amorphous semiconductor film by a method such as evaporation or sputtering may also be used. Further, an example of forming the metallic element containing layer 1901 on the entire surface of the amorphous semiconductor film 1503a is shown in Embodiment 8, but a process of forming a mask and then selectively forming the metallic element containing layer may also be used.

Heat treatment is performed next for 6 to 16 hours (preferably between 8 and 14 hours) at 500 to 650° C. (preferably between 550 and 600° C.). As a result, crystallization proceeds and a crystalline semiconductor film (a crystalline silicon film in Embodiment 8) 1902 is formed. (See FIG. 22C.) The amorphous silicon film is partially crystallized, and the crystalline silicon film, in which the total surface area of amorphous regions contained within a region which becomes an active layer of one TFT is from 1.0% to 8.0% with respect to the surface area of the region which becomes the active layer of one TFT, is obtained in accordance with the heat treatment process. Further, this becomes the crystalline silicon film in which the surface area of each of the amorphous regions after partial crystallization by the heat treatment process is equal to or less than 10.0 $\mu m^2$, and in which at least one amorphous region having a surface area greater than or equal to 0.30 $\mu m^2$ exists. Note that, when selectively forming the metallic element containing layer, crystallization proceeds in a direction substantially parallel to the substrate (the direction shown by the arrow) with opening portions of the mask as origins, forming a crystalline silicon film in which the crystal growth directions are lined up macroscopically.

There are many faults contained within the crystalline silicon film crystallized by the above method due to the low crystallization temperature, and there are cases where it is insufficient for use as a semiconductor element material. In order to increase the crystallinity of the crystalline silicon film, a laser beam is irradiated on the film, forming a crystalline silicon film 1903 having good crystallinity. (See FIG. 22D.) After laser annealing, the crystalline silicon film is crystallized to 99% or greater in regions which become TFT active layers.

Subsequent processes may be performed in accordance with the steps from FIG. 14C shown in Embodiment 7, obtaining the structure shown in FIG. 20.

Note that, similar to Embodiment 7, it is preferable to remove the remaining metallic element from at least the channel forming regions. It is therefore preferable to perform gettering using the method shown in Embodiment 6.

Embodiment 9

Figure 23:
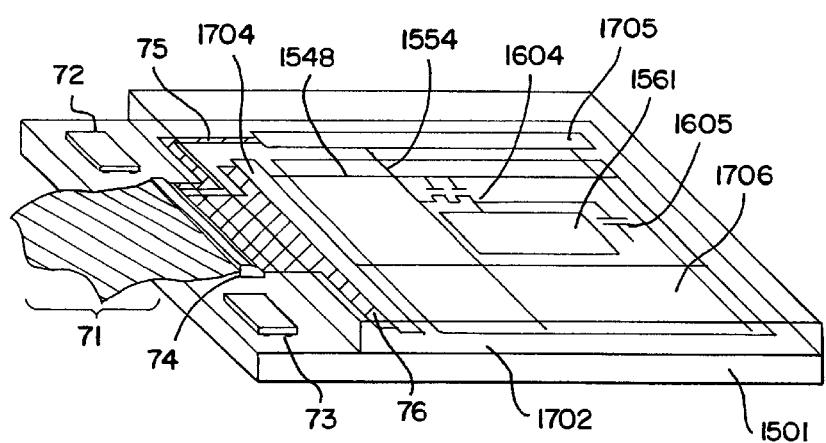
FIG. 23 is a diagram showing an overview of an AM-LCD.

The structure of the active matrix type liquid crystal display device shown in Embodiment 6 is explained with reference to the perspective view of FIG. 23. Note that FIG. 23 corresponds to FIGS. 14A to 19, and therefore common reference numerals are used.

The active matrix substrate is structured by the display region 1706, a scanning signal driver circuit 1704, and an image signal driver circuit 1705 formed on the glass substrate 1500. The pixel TFT 1604 is formed in the display region, and the driver circuit formed in the periphery is structured based on CMOS circuits. The scanning signal driver circuit 1704 and the image signal driver circuit 1705 are connected to the pixel TFT 1604 by the gate wiring 1531 and by the source wiring 1554, respectively. Further, an FPC 71 is connected to an external input terminal 74, and input wirings 75 and 76 are each connected to the driver circuit. Note that reference numeral 1702 denotes the opposing substrate.

Embodiment 10

CMOS circuits and pixel portions formed by implementing the present invention can be used in a variety of electro-optical devices (such as an active matrix liquid crystal display and an active matrix EC display). Namely, the present invention can be implemented for all electronic equipment which incorporates this type of electro-optical device in a display portion.

The following can be given as such electronic equipment: a video camera, a digital camera, a projector (rear type or front type), a head mount display (goggle type display), a car navigation system, a car stereo, a personal computer, and a portable information terminal (such as a mobile computer, a portable telephone, or an electronic book). Some examples of these are shown in FIGS. 24A to 24F, FIGS. 25A to 25D, and FIGS. 26A to 26C.

Figure 24A:
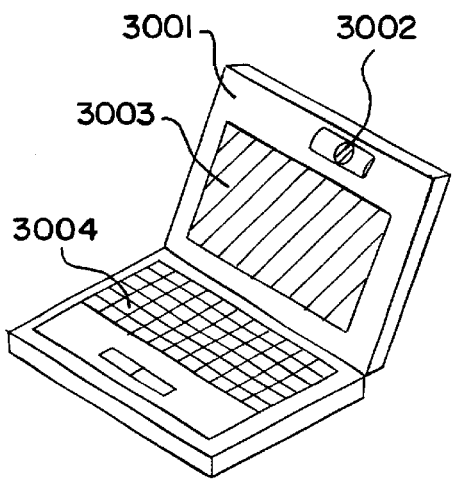
FIGS. 24A to 24F are diagrams showing examples of electronic equipment.

FIG. 24A shows a personal computer and contains components such as a main body 3001, an image input portion 3002, a display portion 3003, and a keyboard 3004. The present invention can be applied to the image input portion 3002, the display portion 3003, and other signal control circuits.

Figure 24B:
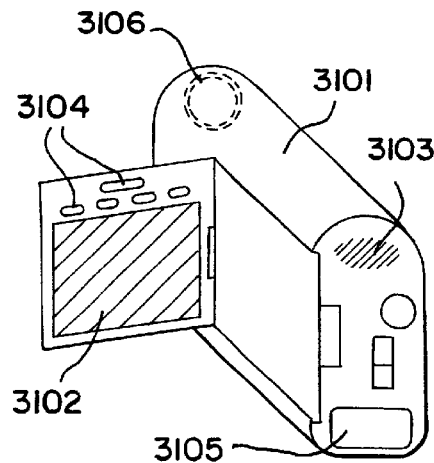

FIG. 24B shows a video camera and contains components such as a main body 3101, a display portion 3102, an audio input portion 3103, operation switches 3104, a battery 3105, and an image receiving portion 3106. The present invention can be applied to the display portion 3102, and other signal control circuits.

Figure 24C:
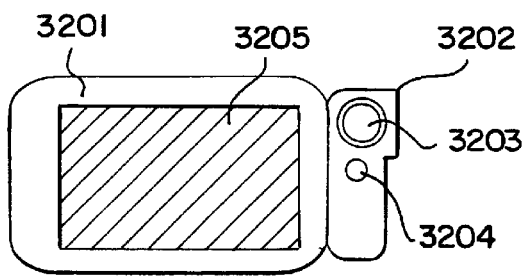

FIG. 24C shows a mobile computer and contains components such as a main body 3201, a camera portion 3202, an image receiving portion 3203, operation switches 3204, and a display portion 3205. The present invention can be applied to the display portion 3205 and other signal control circuits.

Figure 24D:
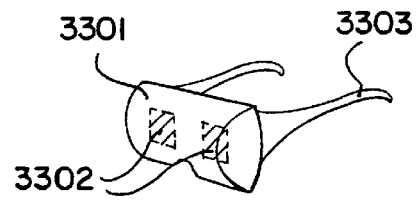

FIG. 24D shows a goggle type display and contains components such as a main body 3301, a display portion 3302, and arm portions 3303. The present invention can be applied to the display portion 3302 and other signal control circuits.

Figure 24E:
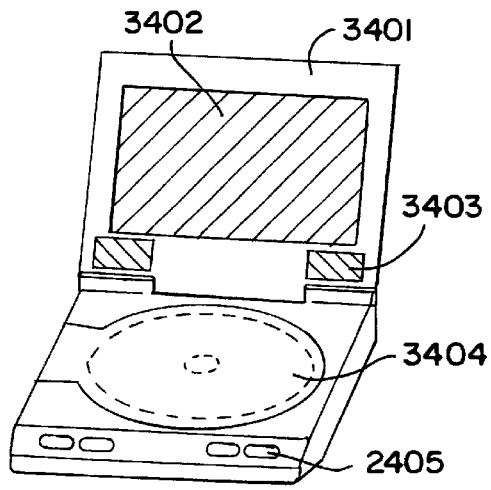

FIG. 24E shows a player which uses a recording medium with a program recorded therein (hereinafter referred to as a recording medium) and contains components such as a main body 3401, a display portion 3402, a speaker portion 3403, a recording medium 3404, and operation switches 3405. Note that a DVD (Digital Versatile Disk) or CD (Compact Disk) is used as a recording medium for this player, and that appreciation of music or a movie or performing games or the Internet can be done. The present invention can be applied to the display device 3402 and other signal control circuits.

Figure 24F:
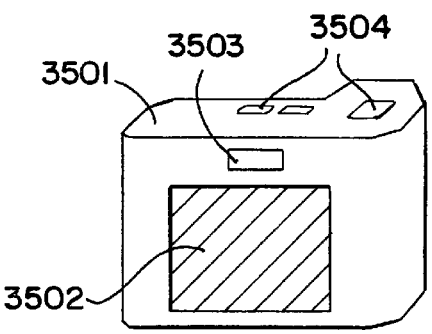

FIG. 24F shows a digital camera and contains components such as a main body 3501, a display portion 3502, an eye piece portion 3503, operation switches 3504, and an image receiving portion (not shown in the figure). The present invention can be applied to the display portion 3502 and other signal control circuits.

FIG. 25A shows a front type projector, and contains components such as a projecting apparatus 3601 and a screen 3602. The present invention can be applied to a liquid crystal display device 3808 which structures a portion of the projecting apparatus 3601, and to other signal control circuits.

FIG. 25B shows a rear type projector, and contains components such as a main body 3701, a projecting apparatus 3702, a mirror 3703, and a screen 3704. The present invention can be applied to the liquid crystal display device 3808 which structures a portion of the projecting apparatus 3702, and to other signal control circuits.

Note that an example of the structure of the projecting apparatuses 3601 and 3702 of FIG. 25A and FIG. 25B is shown in FIG. 25C. The projecting apparatuses 3601 and 3702 are composed of a light source optical system 3801, mirrors 3802 and 3804 to 3806, a dichroic mirror 3803, a prism 3807, the liquid crystal display device 3808, a phase difference plate 3809, and a projecting optical system 3810. The projecting optical system 3810 is composed of an optical system including a projecting lens. A three-plate type example is shown in Embodiment 10, but there are no particular limitations, and a single-plate type may also be used, for example. Further, optical systems such as an optical lens, a film having a light polarizing function, a film for regulating the phase, and an IR film may be suitably placed in the optical path shown by the arrow in FIG. 25C by the operator.

Furthermore, FIG. 25D is a diagram showing one example of the light source optical system 3801 in FIG. 25C. In Embodiment 10, the light source optical system 3801 is composed of a reflector 3811, a light source 3812, lens arrays 3813 and 3814, a polarizing transformation element 3815, and a condenser lens 3816. Note that the light source optical system shown in FIG. 25D is one example, and the light source optical system is not limited to the structure shown in the figure. For example, optical systems such as an optical lens, a film having a light polarizing function, a film for regulating the phase, and an IR film may be suitably added by the operator.

Note that a case using a transmitting type electro-optical device in the projectors shown in FIGS. 25A to 25D is shown here, and an example of applying a reflecting type electro-optical device is not shown in the figures.

Figure 26A:
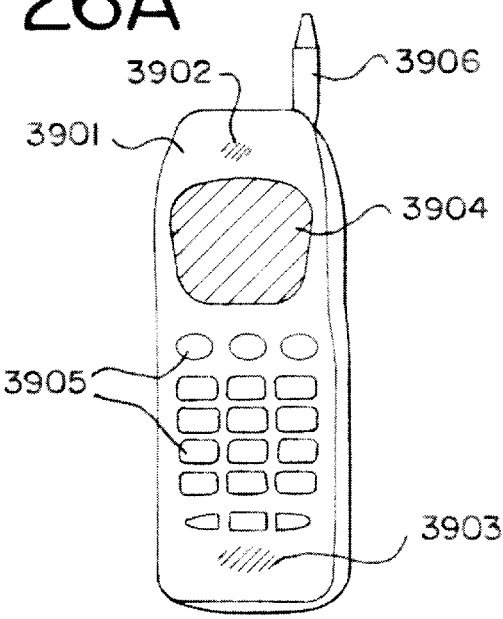
FIGS. 26A to 26C are diagrams showing examples of electronic equipment.

FIG. 26A shows a portable telephone, and contains components such as a main body 3901, an audio output portion 3902, an audio input portion 3903, a display portion 3904, operation switches 3905, and an antenna 3906. The present invention can be applied to the audio output portion 3902, to the audio input portion 3903, to the display portion 3904, and to other signal control circuits.

Figure 26B:
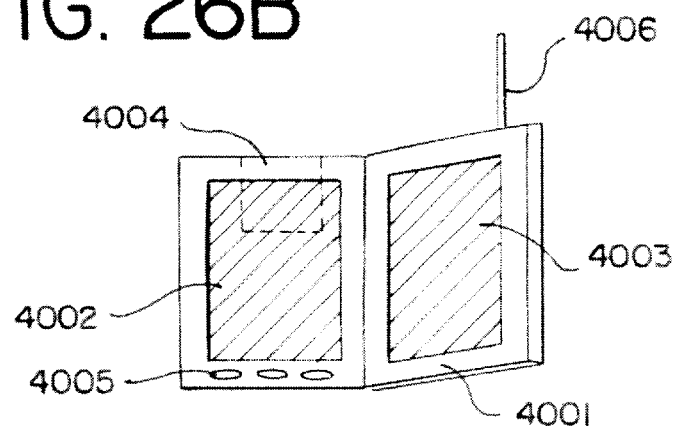

FIG. 26B shows a portable book (electronic book), and contains components such as a main body 4001, display portions 4002 and 4003, a recording medium 4004, operation switches 4005, and an antenna 4006. The present invention can be applied to the display portions 4002 and 4003, and to other signal control circuits.

Figure 26C:
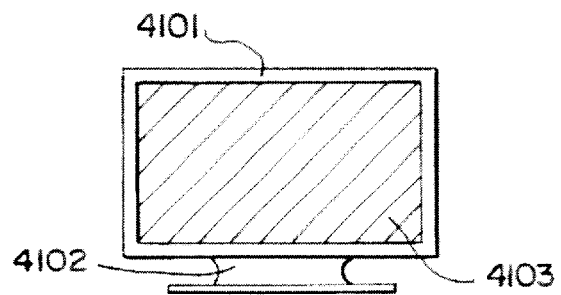

FIG. 26C shows a display, and contains components such as a main body 4101, a support stand 4102, and a display portion 4103. The present invention can be applied to the display portion 4103. The display of the present invention is advantageous for cases of large size screens in particular, and is advantageous for displays having a diagonal equal to or greater than 10 inches (in particular, equal to or greater than 30 inches).

The applicable scope of the present invention of this specification is thus extremely wide, and the present invention can be implemented when manufacturing electronic equipment of all fields. Furthermore, the electronic equipment of Embodiment 10 can be realized by using a constitution in which Embodiments 1 to 9 are freely combined.

Fundamental significance can be obtained as shown below by employing the structure of the present invention:

a. If laser annealing is performed after a heat treatment process for crystallization of an amorphous semiconductor film, or for raising crystallinity, and a TFT is manufactured based on the crystalline semiconductor film obtained, the electrical characteristics of the TFT are within a range which is least influenced by dispersion in the laser beam energy; and b. If a TFT is manufactured using the crystalline semiconductor film, the dispersion of the electrical characteristics of the TFT is in its minimum range.

What is claimed is:

1. A method of manufacturing a semiconductor device, comprising:

introducing, into an amorphous semiconductor film, a metallic element for promoting crystallization of the amorphous semiconductor film;

partially crystallizing the amorphous semiconductor film in accordance with heat treatment, to form a first crystalline semiconductor film possessing a plurality of amorphous regions; and irradiating a laser beam on the first crystalline semiconductor film, to form a second crystalline semiconductor film; and adding an impurity element to the second crystalline semiconductor film after the irradiation of the laser beam to form a source region and a drain region in the second crystalline semiconductor film, wherein:

the surface area of each of the plurality of amorphous regions in a region of the first crystalline semiconductor film which becomes an active layer of a TFT is equal to or less than 10 $\mu m^2$ and among the plurality of amorphous regions, amorphous region has a surface area equal to or greater than 0.3 $\mu m^2$, and wherein a total surface area of the plurality of amorphous regions contained within the region of the first crystalline semiconductor film which becomes the active layer of the TFT is from 1.0% to 8.0% with respect to the surface area of the active layer of the TFT.

2. A method according to claim 1, wherein the metallic element is an element, or a plurality of elements, chosen from the group consisting of Ni, Pd, Pt, Cu, Ag, Au, Al, In, Sn, Pd, P, As, and Sb.

3. A method according to claim 1, wherein the metallic element is one element, or a plurality of elements, chosen from the group consisting of periodic table group 8 elements, group 1B elements, group 3B elements, group 4B elements, and group 5B elements.

4. A method according to claim 1, wherein the semiconductor device is a liquid crystal display device or an image sensor.

5. A method according to claim 1, wherein the semiconductor device is a portable telephone, a video camera, a digital camera, a projector, a goggle type display, a personal computer, a DVD player, an electronic book, or a portable information terminal.

6. A method according to claim 1 wherein the impurity element is boron.

7. A method according to claim 1 wherein the impurity elements is phosphorous.

8. A method according to clam 1 wherein said semiconductor device is one selected from the group consisting of a thin film transistor, a diode and an optical sensor.

9. A method according to claim 1 wherein said laser beam is selected from the group consisting of a third harmonic of YAG laser and an excimer laser beam.

10. A method according to claim 1 wherein the amorphous semiconductor film comprises a material selected from the group consisting of silicon and silicon germanium.

11. A method of manufacturing a semiconductor device, comprising:

introducing, into an amorphous semiconductor film, a metallic element for promoting crystallization of the amorphous semiconductor film;

partially crystallizing the amorphous semiconductor film in accordance with heat treatment, to form a first crystalline semiconductor film possessing a plurality of amorphous regions; and irradiating a laser beam on the first crystalline semiconductor film, to form a second crystalline semiconductor film, wherein:

the surface area of each of the plurality of amorphous regions in a region of the first crystalline semiconductor film which become an active layer of a TFT is equal to or less than 10 $\mu m^2$, and among the plurality of amorphous regions, at least one amorphous region has a surface area equal to or greater than 0.3 $\mu m^2$, and wherein a total surface area of the plurality of amorphous regions contained within the region of the first crystalline semiconductor film which becomes the active layer of the TFT is from 1.0% to 8.0% with respect to the surface area of the active layer of the TFT.

12. A method according to claim 11 wherein the metallic element is an element or a plurality of elements, chosen from the group consisting of Ni, Pd, Pt, Cu, Ag, Au, Al, In, Sn, Pd, P, As, and Sb.

13. A method according to claim 11 wherein the metallic element is one element, or a plurality of elements, chosen from the group consisting of periodic table group 8 elements, group 1B elements, group 3B elements, group 4B elements, and group 5B elements.

14. A method according to claim 11 wherein the semiconductor device is a liquid crystal display device or an image sensor.

15. A method according to claim 11 wherein the semiconductor device is a portable telephone, a video camera, a digital camera, a projector, a goggle type display, a personal computer, a DVD player, an electronic book, or a portable information terminal.

16. A method according to claim 11 wherein said semiconductor device is one selected from the group consisting of a thin film transistor, a diode and an optical sensor.

17. A method according to claim 11 wherein said laser beam is selected from the group consisting of a third harmonic of YAG laser and an excimer laser beam.

18. A method according to claim 11 wherein the amorphous semiconductor film comprises a material selected from the group consisting of silicon and silicon germanium.

* * * * *